(12) United States Patent
Yoshihara

(10) Patent No.: US 11,862,598 B2
(45) Date of Patent: Jan. 2, 2024

(54) SEMICONDUCTOR DEVICE

(71) Applicant: ROHM CO., LTD., Kyoto (JP)

(72) Inventor: Katsuhiko Yoshihara, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 213 days.

(21) Appl. No.: 17/495,372

(22) Filed: Oct. 6, 2021

(65) Prior Publication Data

US 2022/0115351 A1    Apr. 14, 2022

(30) Foreign Application Priority Data

Oct. 12, 2020  (JP) .................................. 2020-171780

(51) Int. Cl.
  *H01L 23/00* (2006.01)
  *H01L 25/07* (2006.01)
  *H01L 23/498* (2006.01)

(52) U.S. Cl.
  CPC ............. *H01L 24/29* (2013.01); *H01L 24/32* (2013.01); *H01L 23/49811* (2013.01); *H01L 24/73* (2013.01); *H01L 24/83* (2013.01); *H01L 25/072* (2013.01); *H01L 2224/29019* (2013.01); *H01L 2224/2957* (2013.01); *H01L 2224/29123* (2013.01); *H01L 2224/29124* (2013.01); *H01L 2224/29639* (2013.01); *H01L 2224/32225* (2013.01); *H01L 2224/73265* (2013.01); *H01L 2224/8383* (2013.01); *H01L 2224/83192* (2013.01)

(58) Field of Classification Search
  CPC ........... H01L 23/4951; H01L 23/49513; H01L 23/49517; H01L 23/49527; H01L 23/49531; H01L 23/49558; H01L 23/498; H01L 23/49805; H01L 23/49833; H01L 2224/83; H01L 2224/8312; H01L 2224/83136; H01L 2224/8314; H01L 2224/83141; H01L 2224/832; H01L 2224/83201; H01L 2224/83203
  See application file for complete search history.

(56) References Cited

U.S. PATENT DOCUMENTS

2015/0270238 A1*  9/2015  Oshima .................. H01L 24/05
                                                  257/762

FOREIGN PATENT DOCUMENTS

JP    2018-157080 A    10/2018

* cited by examiner

*Primary Examiner* — Julio J Maldonado
*Assistant Examiner* — Stanetta D Isaac
(74) *Attorney, Agent, or Firm* — HAMRE, SCHUMANN, MUELLER & LARSON, P.C.

(57) ABSTRACT

There is provided a semiconductor device including: a semiconductor element; a support substrate configured to support the semiconductor element; an intermediate metal layer interposed between the semiconductor element and the support substrate in a thickness direction of the support substrate, wherein the semiconductor element and the intermediate metal layer are bonded by solid phase diffusion bonding; and a first positioning portion including a portion of the semiconductor element and a first portion of the intermediate metal layer and configured to suppress relative movement between the semiconductor element and the intermediate metal layer.

20 Claims, 25 Drawing Sheets

A1

SEMICONDUCTOR DEVICE

CROSS-REFERENCE TO RELATED APPLICATION

This application is based upon and claims the benefit of priority from Japanese Patent Application No. 2020-171780, filed on Oct. 12, 2020, the entire contents of which are incorporated herein by reference.

TECHNICAL FIELD

The present disclosure relates to a semiconductor device.

BACKGROUND

In the related art, an example of a conventional semiconductor device (power module) is known. A semiconductor device in the related art includes a semiconductor element and a support substrate. The semiconductor element is bonded to the support substrate by solid phase diffusion bonding.

In the solid phase diffusion bonding, it is preferable that impurities and the like are as few as possible between the surfaces of objects to be bonded. In a bonding process, the semiconductor element is placed on the support substrate. Next, the semiconductor element and the support substrate are subjected to pressure treatment and heat treatment. If the semiconductor element is displaced with respect to the support substrate after it is mounted, proper bonding will be hindered.

SUMMARY

Some embodiments of the present disclosure provide a semiconductor device capable of suppressing the displacement of semiconductor elements.

According to one embodiment of the present disclosure, there is provided a semiconductor device including: a semiconductor element; a support substrate configured to support the semiconductor element; an intermediate metal layer interposed between the semiconductor element and the support substrate in a thickness direction of the support substrate, wherein the semiconductor element and the intermediate metal layer are bonded by solid phase diffusion bonding; and a first positioning portion including a portion of the semiconductor element and a first portion of the intermediate metal layer and configured to suppress relative movement between the semiconductor element and the intermediate metal layer.

BRIEF DESCRIPTION OF DRAWINGS

The accompanying drawings, which are incorporated in and constitute a part of the specification, illustrate embodiments of the present disclosure.

DETAILED DESCRIPTION

Figure 1:
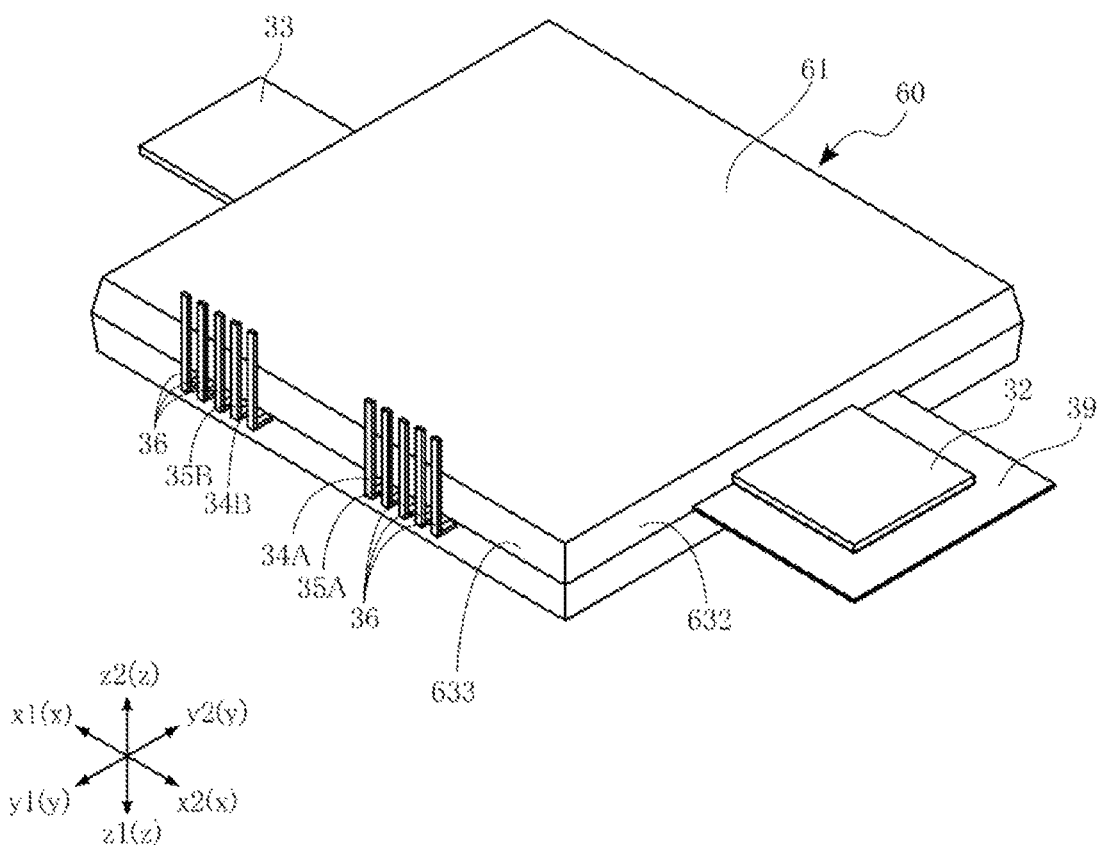
FIG. 1 is a perspective view showing a semiconductor device according to a first embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A semiconductor device of the present disclosure and a method of manufacturing the semiconductor device will be now described with reference to the drawings. In the following, the same or similar elements will be denoted by the same reference numerals, and explanation thereof will not be repeated.

In the present disclosure, phases "a certain thing A is formed in another certain thing B" and "a certain thing A is formed on another certain thing B" include, unless otherwise specified, "a certain thing A is directly formed in another certain thing B" and "a certain thing A is formed on another certain thing B with other thing interposed between the certain thing A and the another thing B." Similarly, phases "a certain thing A is placed in another certain thing B" and "a certain thing A is placed on another certain thing B" include, unless otherwise specified, "a certain thing A is directly placed in another certain thing B" and "a certain thing A is placed in another certain thing B with other thing interposed between the certain thing A and the another thing B." Similarly, a phase "a certain thing A is located on another certain thing B" includes, unless otherwise specified, "a certain thing A is located on another certain thing B in contact of the certain thing A with the another certain thing B" and "a certain thing A is located on another certain thing B with other thing interposed between the certain thing A and the another thing B." In addition, a phase "a certain thing A overlaps with another certain thing B when viewed in a certain direction" includes, unless otherwise specified, "a certain thing A overlaps entirely with another certain thing B" and "a certain thing A overlaps partially with another certain thing B."

First Embodiment

FIGS. 1 to 19 show a semiconductor device according to a first embodiment of the present disclosure. The semiconductor device A1 of the first embodiment includes a plurality of semiconductor elements 10, a support substrate 20, two input terminals 31 and 32, an output terminal 33, a pair of gate terminals 34A and 34B, a pair of detection terminals 35A and 35B, a pair of side terminals 37A and 37B, a plurality of base portions 41, a plurality of connecting members 51, a plurality of connecting members 52, a plurality of intermediate metal layers 7, a sealing member 60, a first positioning portion 81, and a second positioning portion 82.

Figure 2:
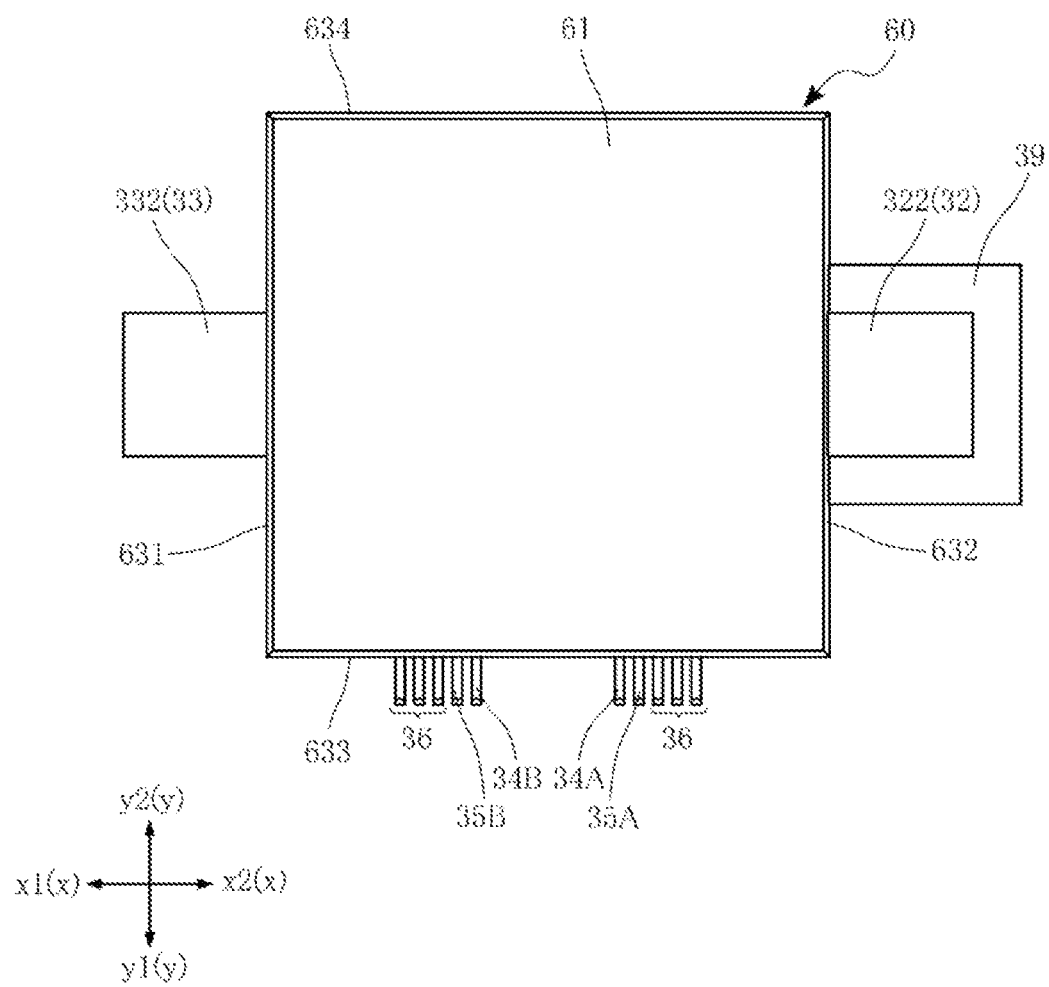
FIG. 2 is a plan view showing the semiconductor device according to the first embodiment.
Figure 3:
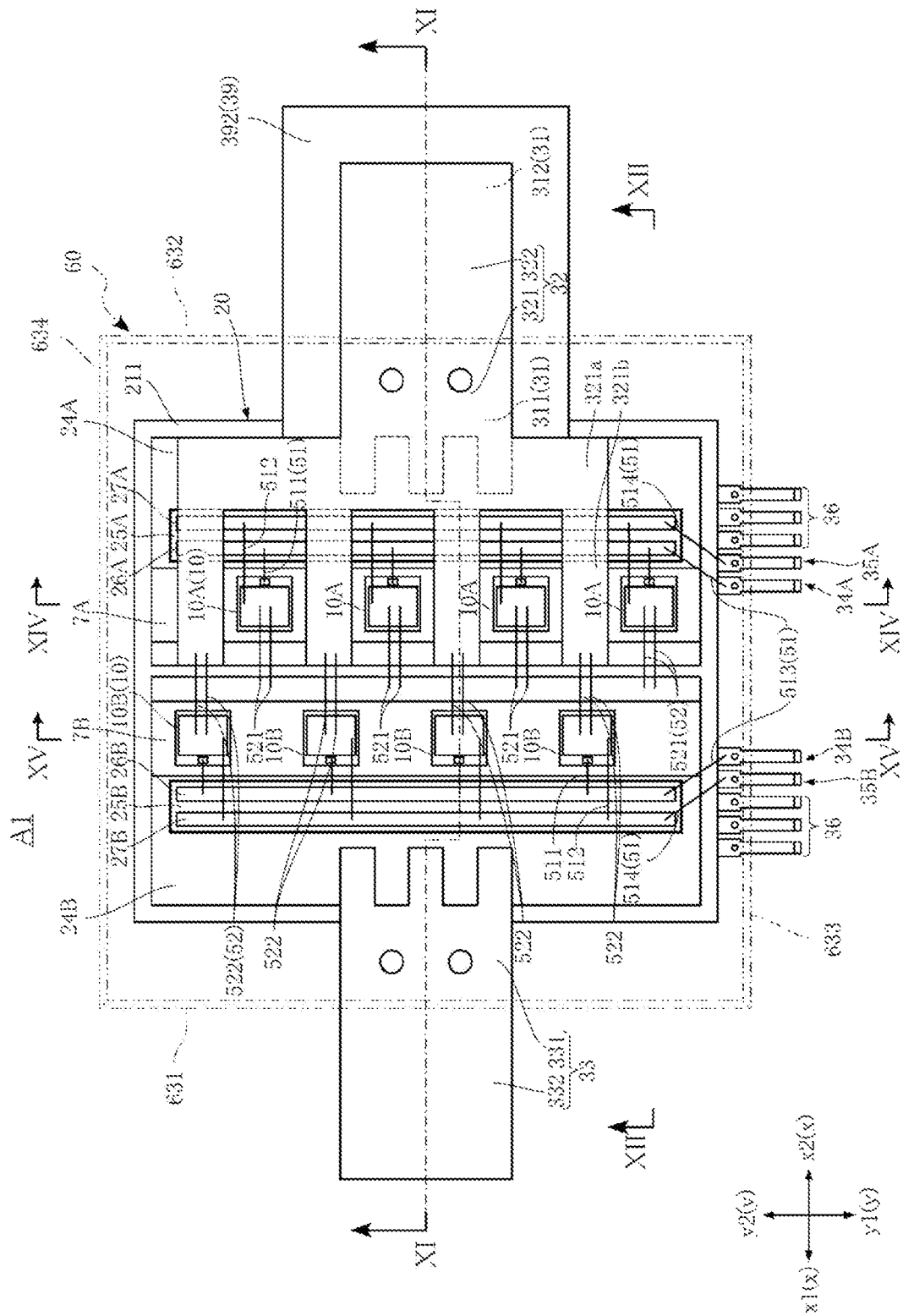
FIG. 3 is the plan view shown in FIG. 2 from which a sealing member is omitted.
Figure 4:
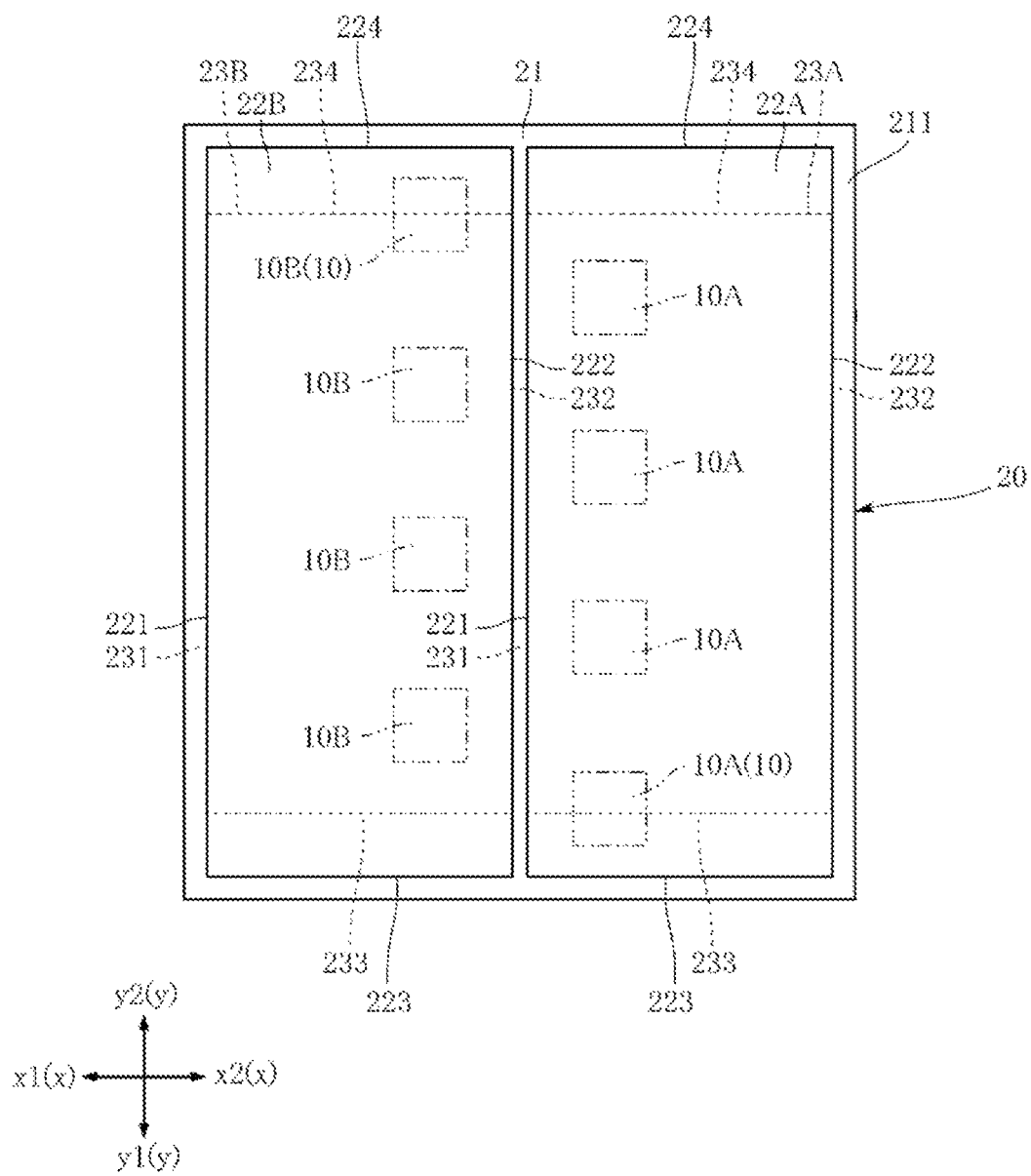
FIG. 4 is a view showing an excerpt of a portion of FIG. 3.
Figure 5:
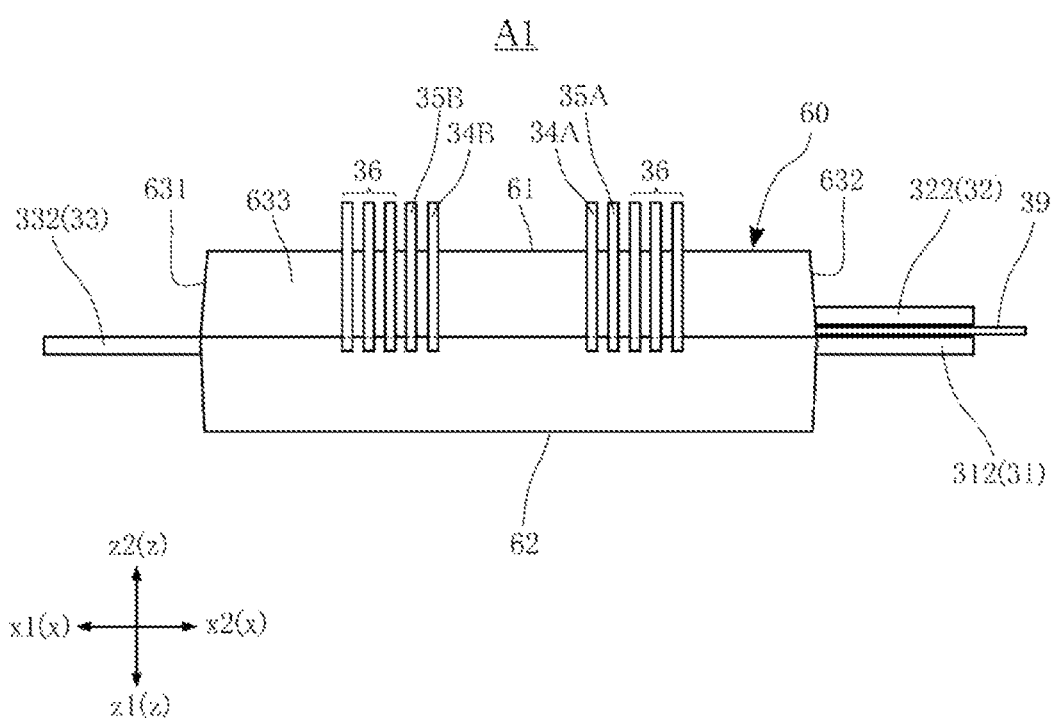
FIG. 5 is a front view showing the semiconductor device according to the first embodiment.
Figure 6:
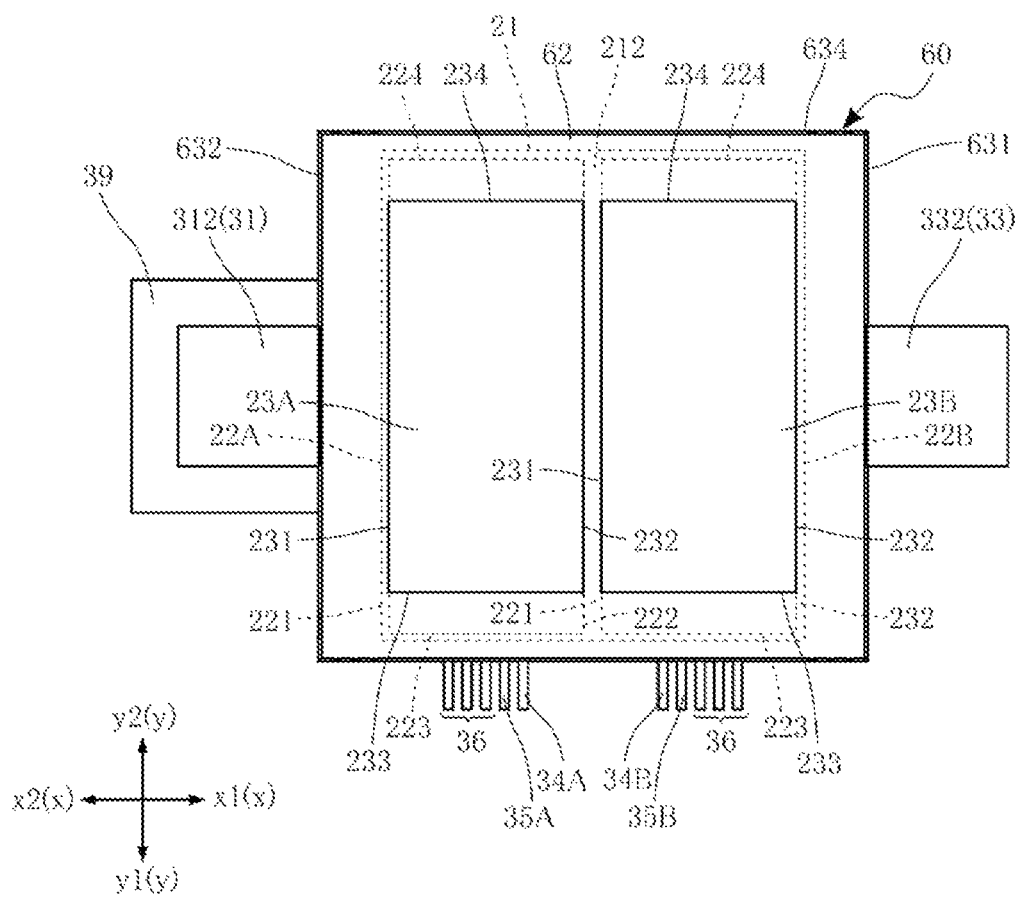
FIG. 6 is a bottom view showing the semiconductor device according to the first embodiment.
Figure 7:
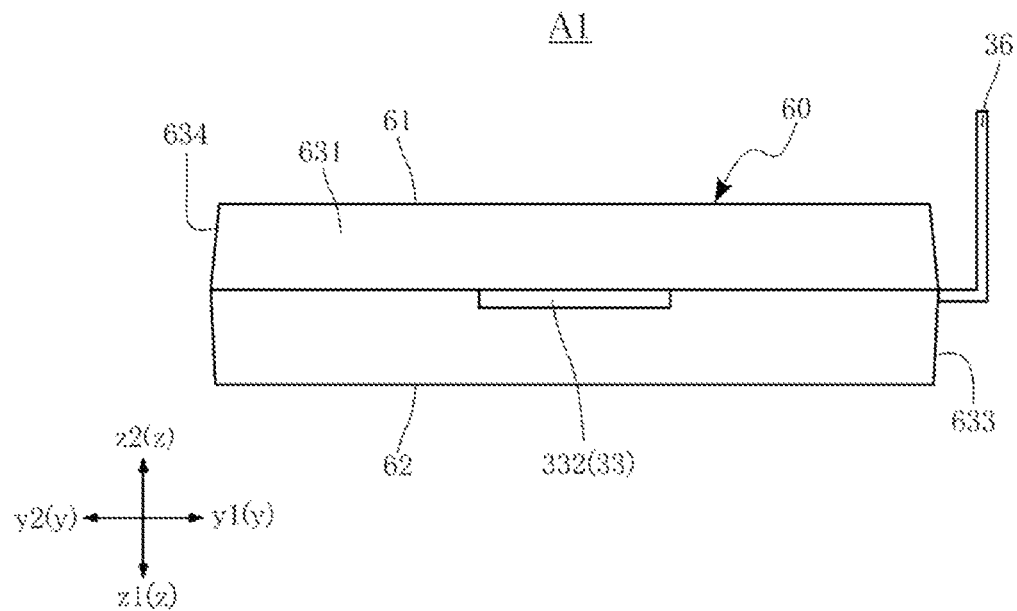
FIG. 7 is a left side view showing the semiconductor device according to the first embodiment.
Figure 8:
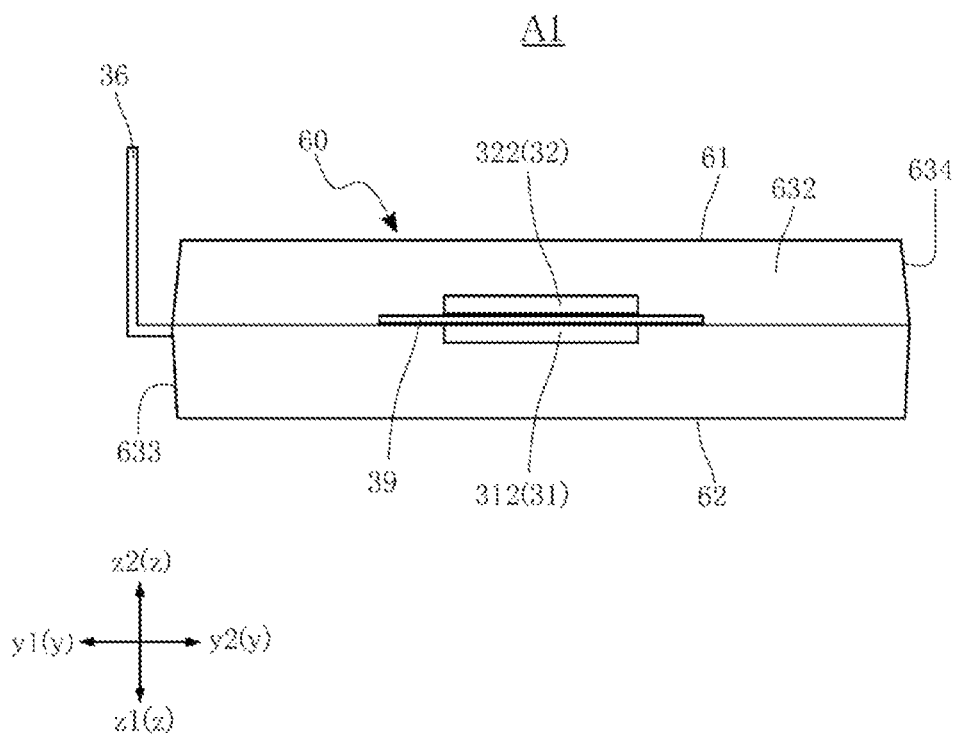
FIG. 8 is a right side view showing the semiconductor device according to the first embodiment.
Figure 9:
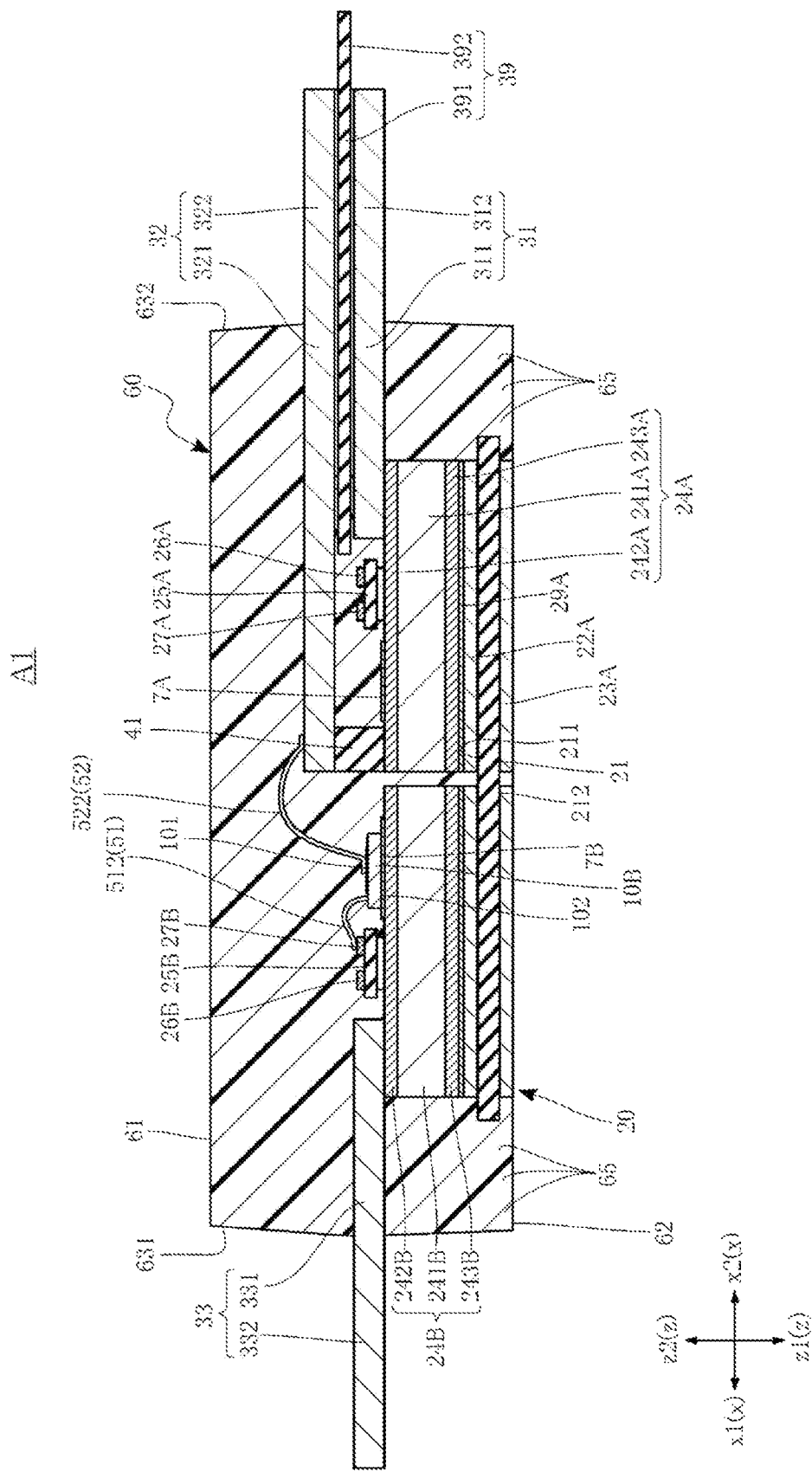
FIG. 9 is a cross-sectional view taken along line IX-IX in FIG. 3.
Figure 10:
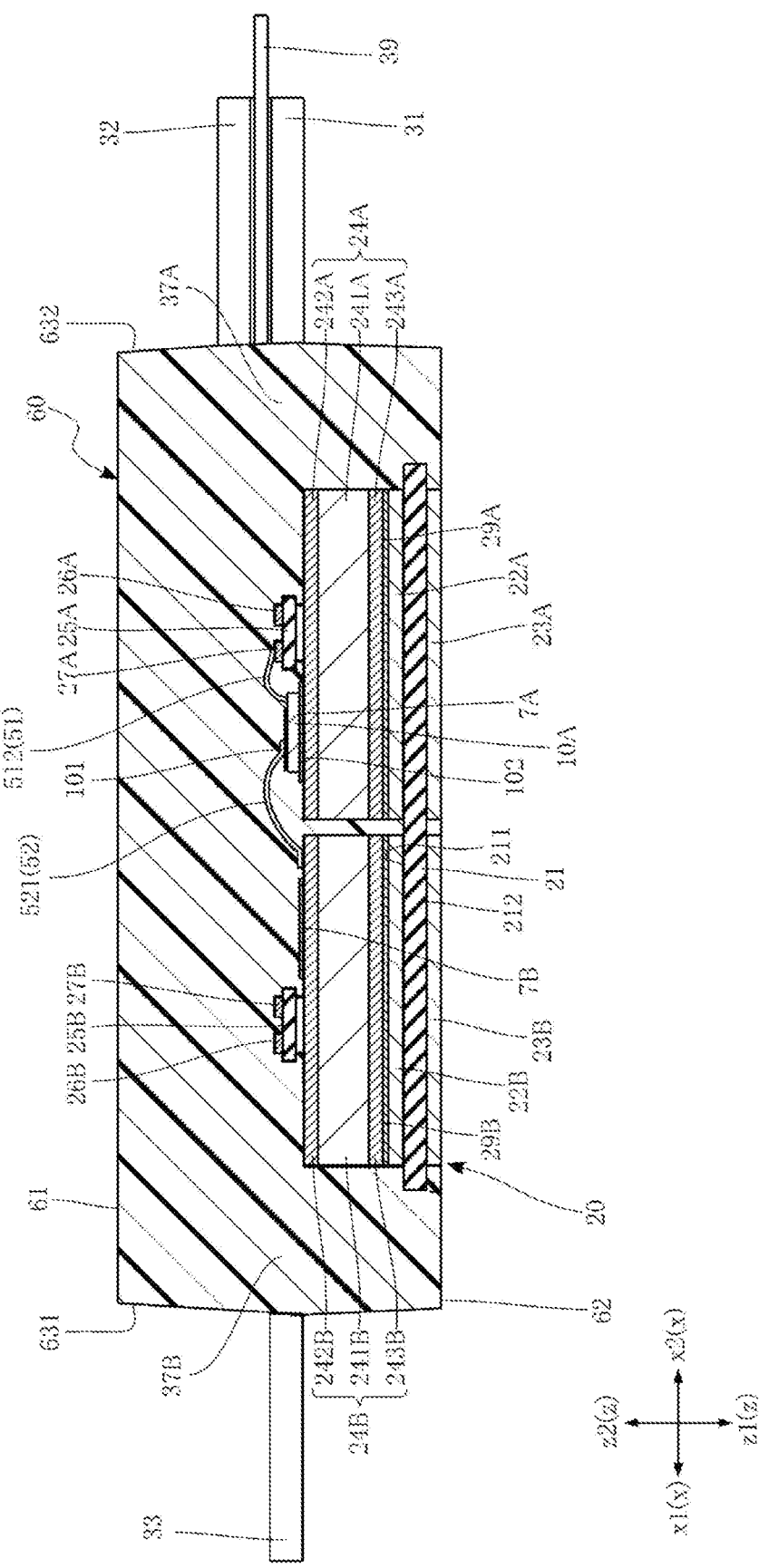
FIG. 10 is a cross-sectional view taken along line X-X in FIG. 3.
Figure 11:
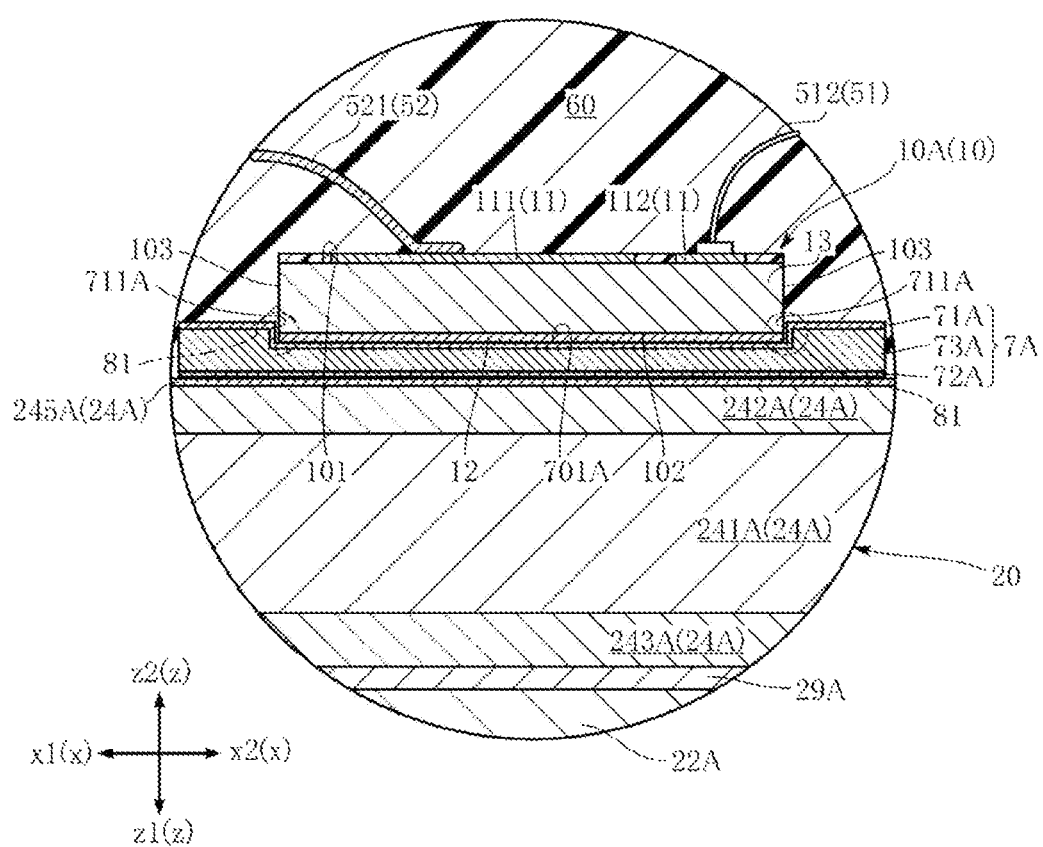
FIG. 11 is an enlarged main part cross-sectional view which is obtained by enlarging a portion of FIG. 10.
Figure 12:
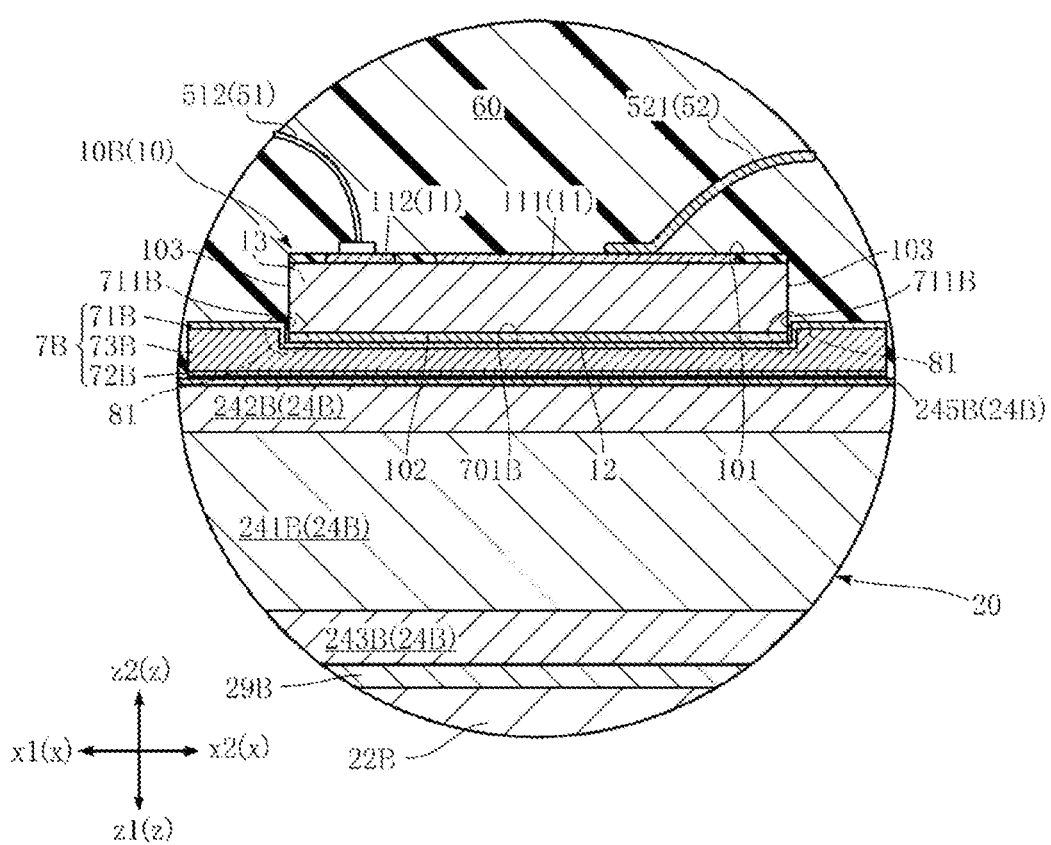
FIG. 12 is an enlarged main part cross-sectional view similar to FIG. 11, which shows a semiconductor element 10B.
Figure 13:
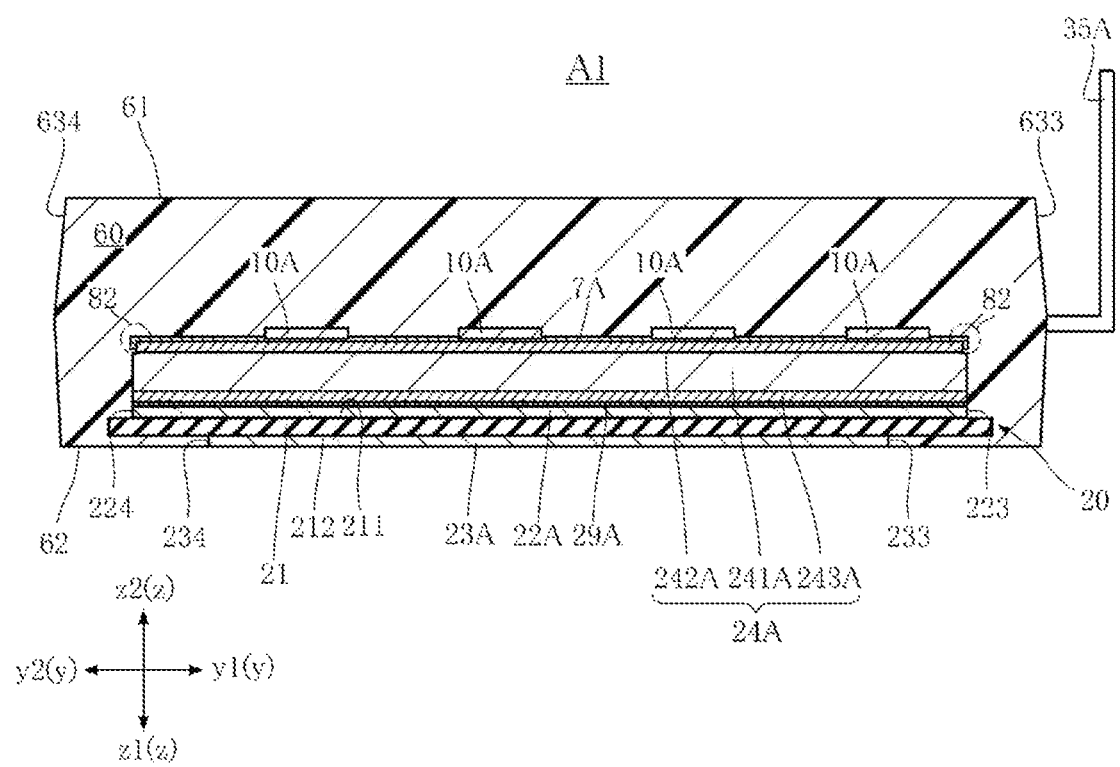
FIG. 13 is a cross-sectional view taken along line XIII-XIII in FIG. 3.
Figure 14:
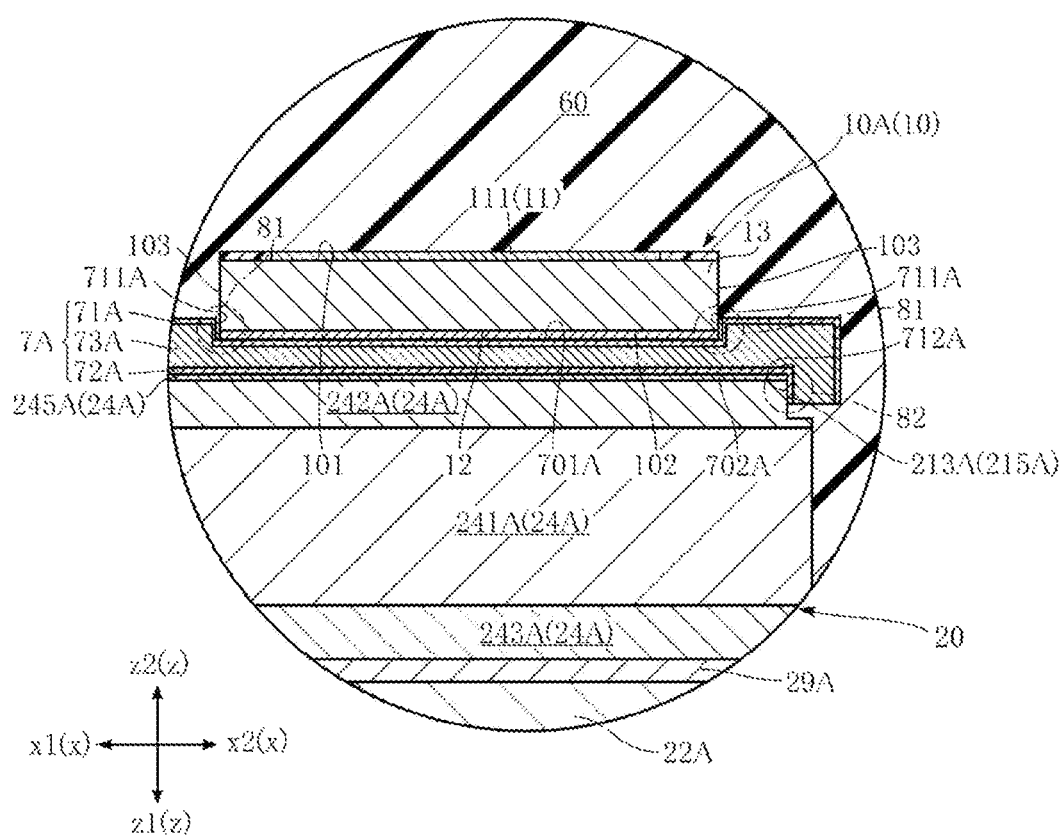
FIG. 14 is an enlarged main part cross-sectional view which is obtained by enlarging a portion of FIG. 13.
Figure 15:
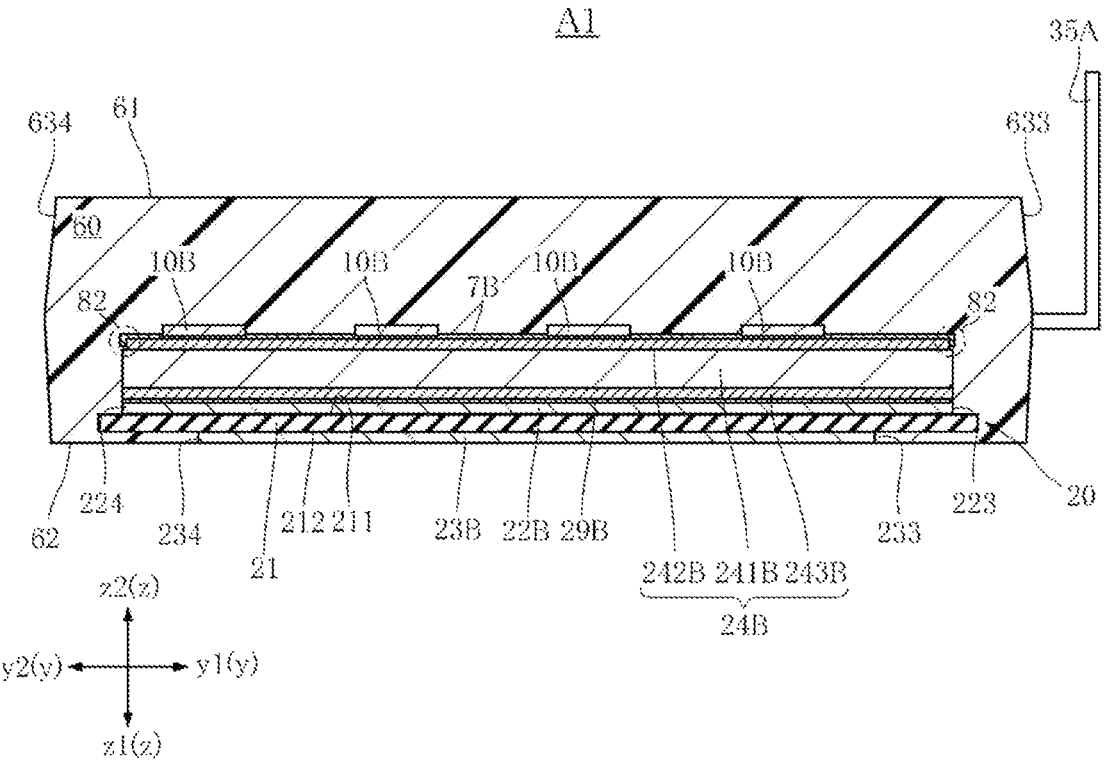
FIG. 15 is a cross-sectional view taken along line XV-XV in FIG. 3.
Figure 16:
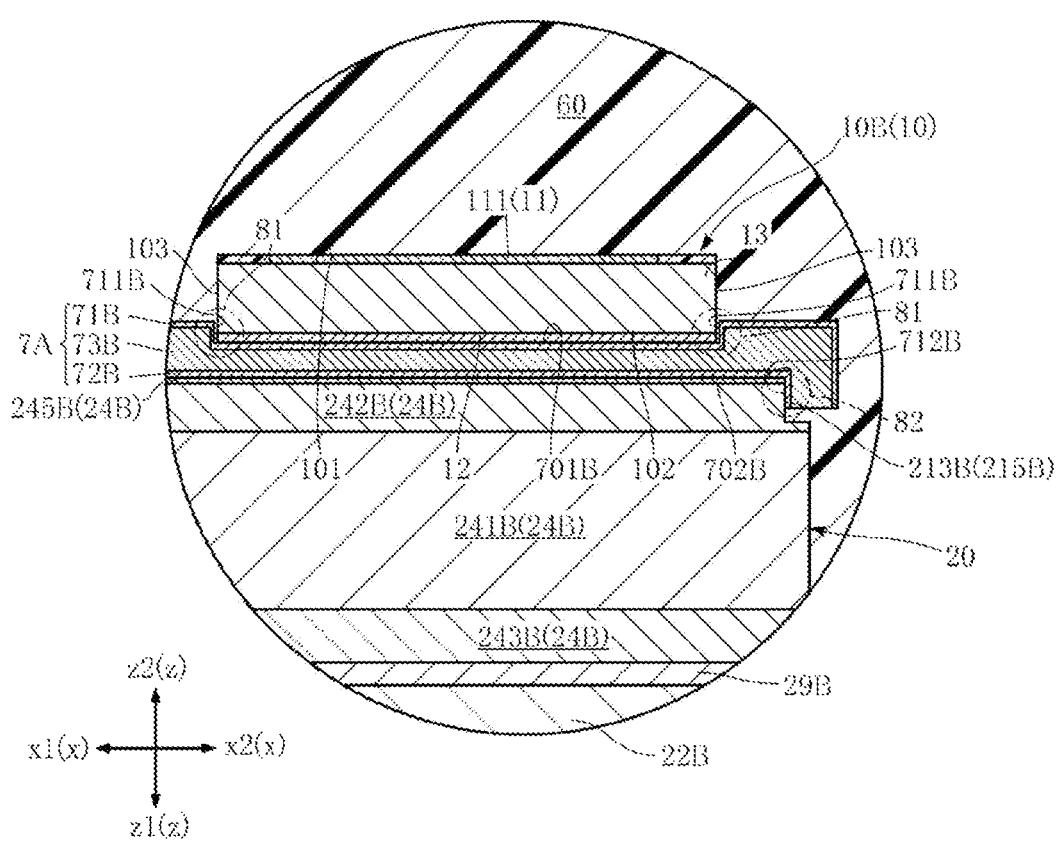
FIG. 16 is an enlarged main part cross-sectional view which is obtained by enlarging a portion of FIG. 15.
Figure 17:
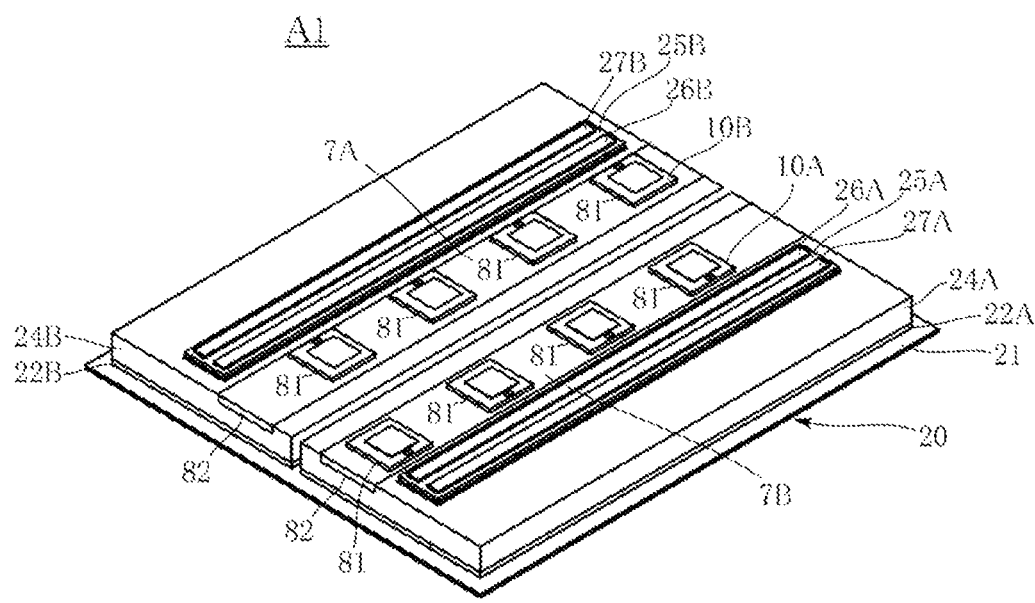
FIG. 17 is a main part perspective view showing the semiconductor device according to the first embodiment.
Figure 18:
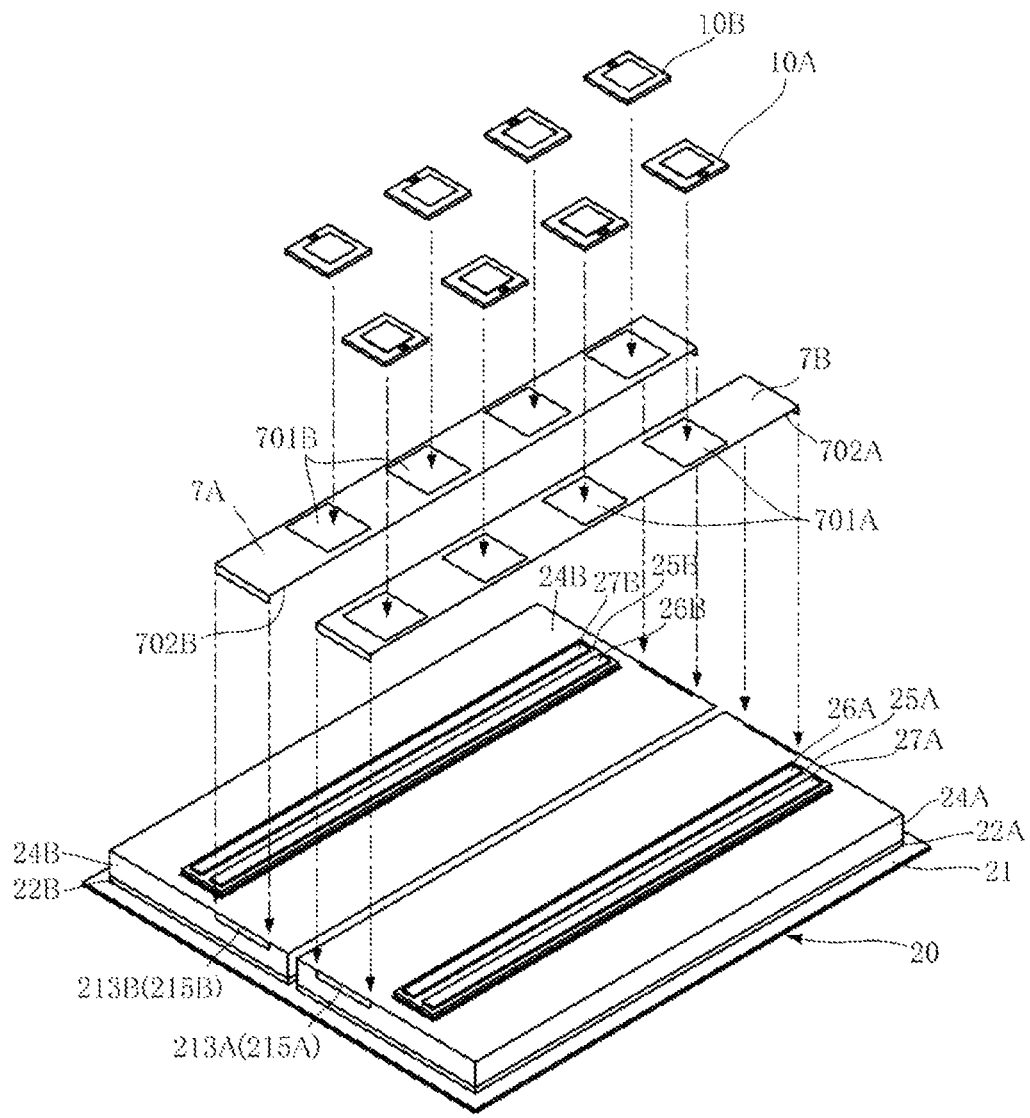
FIG. 18 is an exploded main part perspective view showing the semiconductor device according to the first embodiment.
Figure 19:
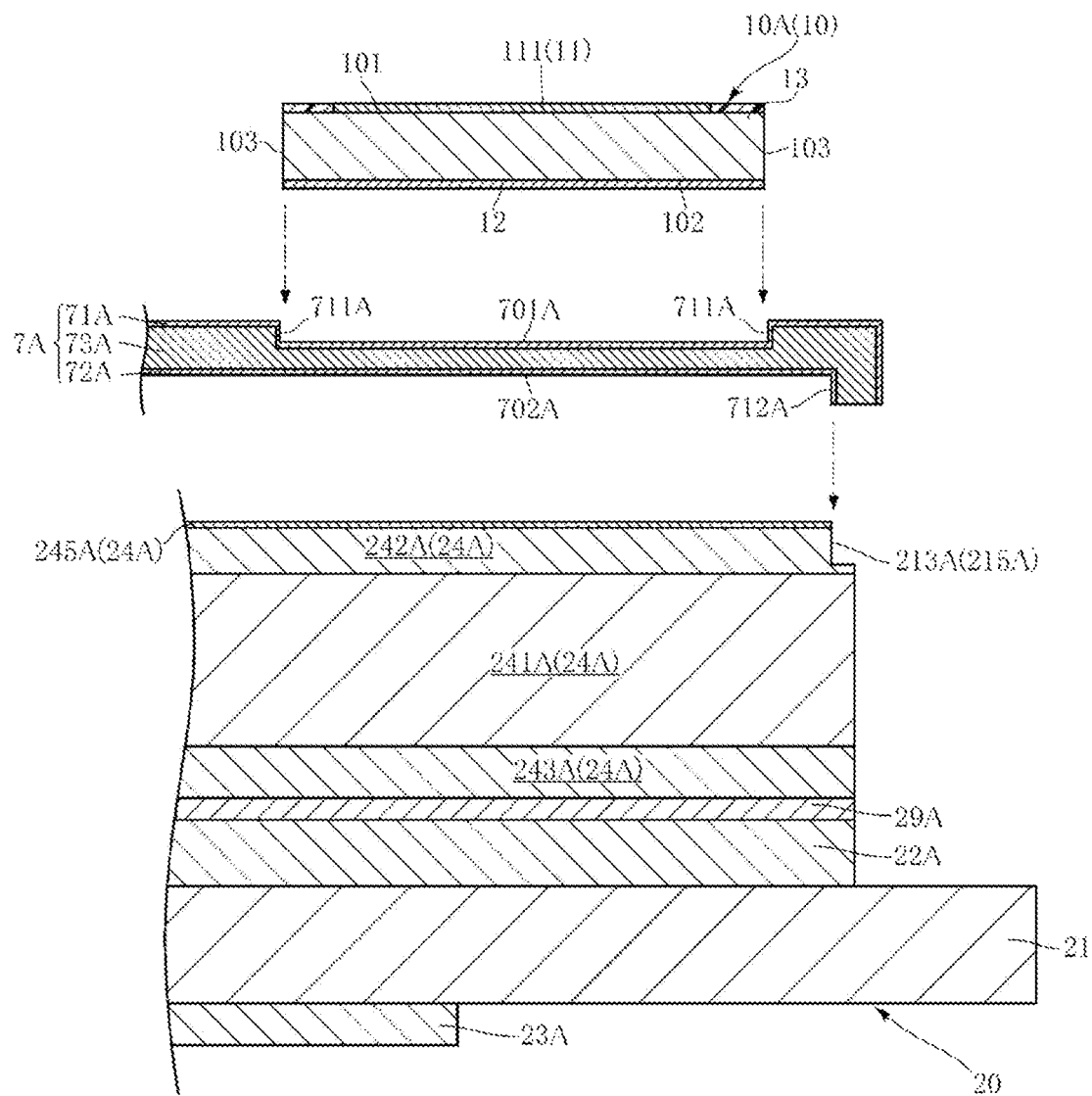
FIG. 19 is an enlarged main part cross-sectional view showing an example of a method of manufacturing the semiconductor device according to the first embodiment.

FIG. 1 is a perspective view showing the semiconductor device A1. FIG. 2 is a plan view showing the semiconductor device A1. FIG. 3 is the plan view shown in FIG. 2 from which the sealing member is omitted. FIG. 4 is view showing an excerpt of a portion of FIG. 3. FIG. 5 is a front view showing the semiconductor device A1. FIG. 6 is a bottom view showing the semiconductor device A1. FIG. 7 is a left side view showing the semiconductor device A1. FIG. 8 is a right side view showing the semiconductor device A1. FIG. 9 is a cross-sectional view taken along line IX-IX in FIG. 3. FIG. 10 is a cross-sectional view taken along line X-X in FIG. 3. FIG. 11 is an enlarged main part cross-sectional view which is obtained by enlarging a portion of FIG. 10. FIG. 12 is an enlarged main part cross-sectional view similar to FIG. 11, which shows a semiconductor element 10B. FIG. 13 is a cross-sectional view taken along line XIII-XIII in FIG. 3. FIG. 14 is an enlarged main part cross-sectional view which is obtained by enlarging a portion of FIG. 13. FIG. 15 is a cross-sectional view taken along line XV-XV in FIG. 3. FIG. 16 is an enlarged main part cross-sectional view which is obtained by enlarging a portion of FIG. 15. FIG. 17 is a main part perspective view showing the semiconductor device A1. FIG. 18 is an exploded main part perspective view showing the semiconductor device A1. FIG. 19 is an enlarged main part cross-sectional view showing an example of a method of manufacturing the semiconductor device A1.

For the sake of convenience of explanation, in FIGS. 1 to 19, three directions orthogonal to one another are defined as an x direction, a y direction, and a z direction, respectively. The x direction is the horizontal direction in the plan view (see FIG. 2) of the semiconductor device A1. The y direction is the vertical direction in the plan view (see FIG. 2) of the semiconductor device A1. If necessary, one in the x direction is defined as an x1 direction, and the other in the x direction is defined as an x2 direction. Similarly, one in the y direction is defined as a y1 direction, the other in the y direction is defined as a y2 direction, one in the z direction is defined as a z1 direction, and the other in the z direction is defined as a z2 direction. In some cases, the z1 direction is referred to as a lower side and the z2 direction is referred to as an upper side. Further, the dimension in the z direction may be referred to as a "thickness." The z direction corresponds to a "thickness direction" of the present disclosure.

[Semiconductor Element 10]

Each of the plurality of semiconductor elements 10 is made of a semiconductor material mainly composed of SiC (silicon carbide). The semiconductor material is not limited to SiC, but may be Si (silicon), GaAs (gallium arsenide), GaN (gallium nitride), or the like. Each of the plurality of semiconductor elements 10 is, for example, a MOSFET (Metal-Oxide-Semiconductor Field-Effect Transistor). Each semiconductor element 10 is not limited to MOSFET, but may be a field effect transistor including a MISFET (Metal-Insulator-Semiconductor FET), a bipolar transistor such as an IGBT (Insulated Gate Bipolar Transistor), an IC chip such as an LSI, a diode, a capacitor, and so on. The plurality of semiconductor elements 10 are all the same elements, for example, n-channel MOSFETs. Each semiconductor element 10 has, for example, a rectangular shape when viewed in the z direction (hereinafter also referred to as "in a plan view"), but is not limited thereto. The thickness of each semiconductor element 10 is, for example, about 50 to 370 μm, specifically about 350 μm, but is not limited thereto.

The plurality of semiconductor elements 10 include a plurality of semiconductor elements 10A and a plurality of semiconductor elements 10B. As shown in FIG. 3, the semiconductor device A1 includes four semiconductor elements 10A and four semiconductor elements 10B. The number of semiconductor elements 10 is not limited to this configuration and may be appropriately changed according to the performance required for the semiconductor device A1. When the semiconductor device A1 is, for example, a half-bridge type switching circuit, the plurality of semiconductor elements 10A form an upper arm circuit in the switching circuit, and the plurality of semiconductor elements 10B form a lower arm circuit in the switching circuit.

As shown in FIGS. 3 and 10, each of the plurality of semiconductor elements 10A is mounted on the support substrate 20 (a conductive member 24A to be described later). The plurality of semiconductor elements 10A are lined up in the y direction and are separated from each other. As shown in FIGS. 3 and 10, each semiconductor element 10A is conductively bonded to the support substrate 20 (the conductive member 24A) via the intermediate metal layer 7A. The semiconductor element 10A and the intermediate metal layer 7A are in contact with each other by solid phase diffusion bonding. In the present disclosure, "A and B are bonded by solid phase diffusion bonding" means that A and B are fixed to each other in a state of being in direct contact with each other at a bonding interface as a result of solid phase diffusion bonding, and can be said that a solid phase diffusion bonding layer is composed of A and B. If the solid phase diffusion bonding is performed under the ideal conditions, the bonding interface may not be clearly present due to diffusion of metal elements. On the other hand, if an inclusion such as an oxide film is present on the surface layers of A and B, or if there are voids between A and B, these inclusion and voids may be present at the bonding interface.

As shown in FIGS. 3 and 9, each of the plurality of semiconductor elements 10B is mounted on the support substrate 20 (a conductive member 24B to be described later). The plurality of semiconductor elements 10B are lined up in they direction and are separated from each other. As shown in FIGS. 3 and 9, each semiconductor element 10B is conductively bonded to the support substrate 20 (the conductive member 24B) via the intermediate metal layer 7B. The semiconductor element 10A and the intermediate metal layer 7B are bonded by solid phase diffusion bonding. In the example shown in FIG. 3, the plurality of semiconductor elements 10A and the plurality of semiconductor elements 10B are arranged side by side alternately when viewed along the x direction, but the plurality of semiconductor elements 10A and the plurality of semiconductor elements 10B may be arranged so as to overlap when viewed along the x direction.

As shown in FIGS. 9 to 16, each of the plurality of semiconductor elements 10 (the plurality of semiconductor elements 10A and the plurality of semiconductor elements 10B) has an element main surface 101, an element back surface 102, and an element facing surface 103. A semiconductor element 10A is shown in FIG. 11, and a semiconductor element 10B is shown in FIG. 12. In the illustrated example, the configurations of the respective parts of the semiconductor element 10A and the semiconductor element 10B are common. In each semiconductor element 10, the element main surface 101 and the element back surface 102 are separated from each other in the z direction. The element main surface 101 faces the z2 direction, and the element back surface 102 faces the z1 direction. Each element facing surface 103 is a surface facing a direction intersecting the z direction. In the present embodiment, four element facing surfaces 103 facing the x direction (the x1 direction and the x2 direction) and the y direction (the y1 direction and the y2 direction) are provided. The element back surface 102 of the semiconductor element 10A faces the conductive member 24A. The element back surface 102 of each semiconductor element 10B faces the conductive member 24B.

As shown in FIGS. 11 and 12, each of the plurality of semiconductor elements 10 has a main surface electrode 11, a back surface electrode 12, and an insulating film 13.

The main surface electrode 11 is provided on the element main surface 101. The main surface electrode 11 includes a first electrode 111 and a second electrode 112, as shown in FIGS. 11 and 12. The first electrode 111 is, for example, a source electrode through which a source current flows. The second electrode 112 is, for example, a gate electrode to which a gate voltage for driving each semiconductor element 10 is applied. The first electrode 111 is larger than the second electrode 112. In the illustrated example, a case where the first electrode 111 is composed of one region is shown, but it may be divided into a plurality of regions.

The back surface electrode 12 is provided on the element back surface 102, as shown in FIGS. 11 and 12. The back surface electrode 12 is formed over the entire element back surface 102. The back surface electrode 12 is, for example, a drain electrode through which a drain current flows. At least the surface layer of the back surface electrode 12 is made of first metal. The first metal is metal bonded by solid phase diffusion bonding, for example, Ag, Cu, Ni, Fe, or Al. The entire back surface electrode 12 may be made of the first metal, or may have, for example, a structure in which a surface layer made of the first metal is laminated on a metal layer made of a different type of metal.

The insulating film 13 is provided on the element main surface 101, as shown in FIGS. 11 and 12. The insulating film 13 has an electrical insulating property. The insulating film 13 surrounds the main surface electrode 11 in a plan view. The insulating film 13 insulates the first electrode 111 and the second electrode 112 from each other. The insulating film 13 is formed by stacking, for example, a $SiO_2$ (silicon dioxide) layer, a $SiN_4$ (silicon nitride) layer, and a polybenzoxazole layer in this order from the element main surface 101. The configuration of the insulating film 13 is not limited to that described above, and for example, a polyimide layer may be used instead of the polybenzoxazole layer.

[Support Substrate 20]

The support substrate 20 supports the plurality of semiconductor elements 10. The support substrate 20 includes an insulating substrate 21, a pair of main surface metal layers 22A and 22B, a pair of back surface metal layers 23A and 23B, a pair of conductive members 24A and 24B, a pair of insulating layers 25A and 25B, a pair of gate layers 26A and 26B, and a pair of detection layers 27A and 27B. The insulating substrate 21, the pair of main surface metal layers 22A and 22B, and the pair of back surface metal layers 23A and 23B are composed as a so-called DBC (Direct Bonded Copper) substrate. In the present embodiment, the case of a DBC substrate is shown, but the present disclosure is not limited thereto, and for example, a DBA (Direct Bonded Aluminum) substrate may be used.

The insulating substrate 21 insulates the main surface metal layers 22A and 22B and the back surface metal layers 23A and 23B from each other. The constituent material of the insulating substrate 21 is, for example, ceramics having excellent thermal conductivity. As such ceramics, for example, AlN (aluminum nitride), SiN (silicon nitride), $Al_2O_3$ (aluminum oxide), and the like are used. Further, as the material of the insulating substrate 21, an insulating resin material may be used instead of ceramics. Examples of such an insulating resin material may include an epoxy-based resin material and a PDMS (polydimethylsiloxane)-based resin material. The thickness of the insulating substrate 21 is, for example, about 0.32 mm. As shown in FIG. 3, the insulating substrate 21 has a rectangular shape in a plan view. The insulating substrate 21 has a flat plate shape.

As shown in FIGS. 9, 10, 13, and 15, the insulating substrate 21 has a main surface 211 and a back surface 212. The main surface 211 and the back surface 212 are separated from each other in the z direction. The main surface 211 faces the z2 direction, and the back surface 212 faces the z1 direction. The pair of main surface metal layers 22A and 22B is arranged on the main surface 211. The pair of back surface metal layers 23A and 23B is arranged on the back surface 212.

The pair of main surface metal layers 22A and 22B is arranged on the main surface 211 of the insulating substrate 21, as shown in FIGS. 9, 10, 13, and 15. The pair of main surface metal layers 22A and 22B is separated from each other and is lined up in the x direction. The constituent material of each of the main surface metal layers 22A and 22B is, for example, Cu (copper), a Cu alloy, or Al (aluminum). The thickness of each of the main surface metal layers 22A and 22B is, for example, about 0.2 mm. Each of the main surface metal layers 22A and 22B has substantially a rectangular shape in a plan view. Each of the main surface metal layers 22A and 22B has, for example, a dimension of about 20 mm in the x direction and a dimension of about 30 mm in the y direction.

As shown in FIGS. 4 and 6, each of the main surface metal layers 22A and 22B has a pair of end edges 221 and 222 and a pair of end edges 223 and 224. Each of the pair of end edges 221 and 222 extends in the y direction in a plan view. The pair of end edges 221 and 222 is separated from each other in the x direction. The end edge 222 is located in the x2 direction with respect to the end edge 221. In the examples shown in FIGS. 4 and 6, the pair of end edges 221 and 222 is substantially parallel to each other. Each of the pair of end edges 223 and 224 extends in the x direction in a plan view. The pair of end edges 223 and 224 is separated from each other in the y direction. The end edge 224 is located in the y2 direction with respect to the end edge 223. In the examples shown in FIGS. 4 and 6, since each of the main surface metal layers 22A and 22B has a rectangular shape in a plan view, the pair of end edges 221 and 222 and the pair of end edges 223 and 224 are substantially parallel to each other.

The pair of back surface metal layers 23A and 23B is arranged on the back surface 212 of the insulating substrate 21, as shown in FIGS. 9, 10, 13, and 15. The pair of back surface metal layers 23A and 23B is separated from each other and are lined up in the x direction. The lower surface (a surface facing the z1 direction) of each of the back surface metal layers 23A and 23B is exposed from the sealing member 60. For example, a heat sink (not shown) may be connected to the lower surface of each of the back surface metal layers 23A and 23B. The constituent material of each of the back surface metal layers 23A and 23B is the same as that of each of the main surface metal layers 22A and 22B. That is, the constituent material of each of the back metal layers 23A and 23B is, for example, Cu, a Cu alloy, or Al. The thickness of each of the back surface metal layers 23A and 23B is, for example, about 0.2 mm. Each of the back surface metal layers 23A and 23B has substantially a rectangular shape in a plan view. Each of the back surface metal layers 23A and 23B has, for example, a dimension of about 20 mm in the x direction and a dimension of about 23 mm in the y direction. The dimension of each of the back surface metal layers 23A and 23B in the y direction is not limited to the above-mentioned value (23 mm), but may be about 75 to 90% of the dimension of each of the main surface metal layers 22A and 22B in the y direction. The back surface metal layer 23A corresponds to a "first back surface metal layer" described in the claims, and the back surface metal layer 23B corresponds to a "second back surface metal layer" described in the claims.

As shown in FIGS. 4 and 6, each of the back surface metal layers 23A and 23B has a pair of end edges 231 and 232 and a pair of end edges 233 and 234. Each of the pair of end edges 231 and 232 extends in the y direction in a plan view. The pair of end edges 231 and 232 is separated from each other in the x direction. The end edge 232 is located in the x2 direction with respect to the end edge 231. Each of the pair of end edges 233 and 234 extends in the x direction in a plan view. The pair of end edges 233 and 234 is separated from each other in the y direction. The end edge 234 is located in the y2 direction with respect to the end edge 233. In the examples shown in FIGS. 4 and 6, since each of the back surface metal layers 23A and 23B has a rectangular shape in a plan view, the pair of end edges 231 and 232 and the pair of end edges 233 and 234 are substantially parallel to each other.

As shown in FIG. 4, the end edge 233 of the back surface metal layer 23A overlaps the semiconductor element 10A located closest to the y1 direction among the plurality of semiconductor elements 10A in a plan view. The end edge 234 of the back surface metal layer 23B overlaps the semiconductor element 10B located closest to the y2 direction among the plurality of semiconductor elements 10B in a plan view.

In the support substrate 20, as shown in FIGS. 4 and 6, the main surface metal layer 22A and the back surface metal layer 23A overlap in a plan view, and the main surface metal layer 22B and the back surface metal layer 23B overlap in a plan view. In particular, in the example shown in FIG. 4, in a plan view, the center of each of the main surface metal layers 22A and 22B in the y direction and the center of each of the back surface metal layers 23A and 23B in the y direction overlap each other. The end edge 231 of each of the back surface metal layers 23A and 23B overlaps the end edge 221 of each of the main surface metal layers 22A and 22B in a plan view, and the end edge 232 of each of the back surface metal layers 23A and 23B overlaps the end edge 222 of each of the main surface metal layers 22A and 22B in a plan view. Further, the end edge 233 of each of the back surface metal layers 23A and 23B overlaps each of the main surface metal layers 22A and 22B in a plan view and is located in the y2 direction with respect to the end edge 223 of each of the main surface metal layers 22A and 22B. The edge 234 of each of the back surface metal layers 23A and 23B overlaps each of the main surface metal layers 22A and 22B in a plan view and is located in the y1 direction with respect to the end edge 224 of each of the main surface metal layers 22A and 22B. Each of the end edges 221, 222, 231, and 232 corresponds to a "first end edge" described in the claims, and each of the end edges 223, 224, 233, and 234 corresponds to a "second end edge" described in the claims.

As shown in FIGS. 3, 9, 10, and 17, the pair of conductive members 24A and 24B is separated from each other and is lined up in the x direction. The conductive member 24A is arranged on the main surface metal layer 22A, and the conductive member 24B is arranged on the main surface metal layer 22B. The plurality of semiconductor elements 10A are arranged on the conductive member 24A, and the plurality of semiconductor elements 10B are arranged on the conductive member 24B. The conductive member 24A includes a conductive layer 241A, two metal layers 242A and 243A, and a support surface layer 245A. The conductive member 24B includes a conductive layer 241B, two metal layers 242B and 243B, and a support surface layer 245B. The conductive members 24A and 24B may be composed of a single metal layer and the support surface layers 245A and 245B.

Each of the conductive layers 241A and 241B is composed of, for example, graphite. As described above, graphite has a hexagonal crystal structure and is layered, and its thermal conductivity is anisotropic between a direction parallel to the layer and a direction orthogonal to the layer. The thermal conductivity in the direction parallel to the layer is about 1,500 W/mK, and the thermal conductivity in the direction orthogonal to the layer is about 5 W/mK. Each of the conductive layers 241A and 241B is arranged in the direction parallel to the layer along the z direction. Further, as described above, graphite has anisotropy in the coefficient of linear expansion. The coefficient of linear expansion in the direction parallel to the layer is about 0 ppm/K, and the coefficient of linear expansion in the direction orthogonal to the layer is about 25 ppm/K. Each of the conductive layers 241A and 241B is arranged in the direction orthogonal to the layer along they direction. Therefore, each of the conductive layers 241A and 241B is arranged so that the coefficient of linear expansion in they direction is about 25 ppm/K and the coefficient of linear expansion in the x direction is about 0 ppm/K. That is, each of the conductive layers 241A and 241B is arranged in a direction in which the coefficient of linear expansion is relatively large along the y direction.

As shown in FIGS. 9 to 16, the metal layers 242A and 242B are arranged on the upper surfaces (the surfaces facing the z2 direction) of the conductive layers 241A and 241B, respectively. The constituent material of each of the metal layers 242A and 242B is, for example, Cu or a Cu alloy. The metal layers 242A and 242B are provided to improve the bonding between the conductive members 24A and 24B and the semiconductor elements 10A and 10B, respectively. The thickness of each of the metal layers 242A and 242B is, for example, about 0.1 to 2.0 mm.

A substrate recess 215A is formed in the metal layer 242A of the present embodiment. The substrate recess 215A is recessed inward in the x direction from the end portion of the metal layer 242A in the x direction. In the illustrated example, two substrate recesses 215A are provided at both ends of the metal layer 242A in the x direction, respectively. The inner surface of the substrate recess 215A is a substrate facing surface 213A. In the illustrated example, the substrate facing surface 213A faces outward in the x direction. The substrate recess 215A and the substrate facing surface 213A may be provided on the constituent elements of the support substrate 20, and are not limited to the configuration formed on the metal layer 242A. Further, a substrate recess 215B is formed in the metal layer 242B of the present embodiment. The substrate recess 215B is recessed inward in the x direction from the end portion of the metal layer 242B in the x direction. In the illustrated example, two substrate recesses 215B are provided at both ends of the metal layer 242B in the x direction, respectively. The inner surface of the substrate recess 215B is a substrate facing surface 213B. In the illustrated example, the substrate facing surface 213B faces outward in the x direction. The substrate recess 215B and the substrate facing surface 213B may be provided on the constituent elements of the support substrate 20, and are not limited to the configuration formed on the metal layer 242B.

The support surface layer 245A is laminated on the metal layer 242A. The support surface layer 245A is a layer made of a second metal. The second metal is a metal bonded by solid phase diffusion bonding and is, for example, Ag, Cu, Ni, Fe, or Al. The thickness of the support surface layer 245A is not limited in any way and is, for example, 0.5 μm to 5.0 μm. In the illustrated example, it is, for example, about 2.0 μm. The support surface layer 245B is laminated on the metal layer 242B. The support surface layer 245B is a layer made of a second metal. The thickness of the support surface layer 245B is not limited in any way and is, for example, 0.5 μm to 5.0 μm. In the illustrated example, it is, for example, about 2.0 μm.

As shown in FIGS. 9 to 15, the metal layers 243A and 243B are arranged on the lower surfaces (the surfaces facing the z1 direction) of the conductive layers 241A and 241B, respectively. The constituent material of each of the metal layers 243A and 243B is, for example, Cu or a Cu alloy. The metal layers 243A and 243B are provided to improve the bonding between the conductive members 24A and 24B and the main surface metal layers 22A and 22B, respectively. The thickness of each of the metal layers 243A and 243B is, for example, about 0.1 to 2.0 mm. Each of the metal layers 242A, 242B, 243A, and 243B corresponds to a "surface metal layer" described in the claims.

As shown in FIGS. 9 to 13, a conductive bonding layer 29A is interposed between the conductive member 24A (the metal layer 243A) and the main surface metal layer 22A. The conductive member 24A is bonded to the main surface metal layer 22A by the conductive bonding layer 29A. As shown in FIGS. 9, 10, and 15, a conductive bonding layer 29B is interposed between the conductive member 24B (the metal layer 243B) and the main surface metal layer 22B. The conductive member 24B is bonded to the main surface metal layer 22B by the conductive bonding layer 29B. Each of the conductive bonding layers 29A and 29B is, any of, for example, solder, metal paste, sintered metal, and the like.

The pair of insulating layers 25A and 25B has an electrical insulating property, and the constituent material thereof is, for example, a glass epoxy resin. As shown in FIG. 3, each of the pair of insulating layers 25A and 25B has a strip shape extending in the y direction. The insulating layer 25A is bonded to the conductive member 24A, as shown in FIGS. 3 and 10. The insulating layer 25A is located in the x2 direction with respect to the plurality of semiconductor elements 10A. The insulating layer 25B is bonded to the conductive member 24B, as shown in FIGS. 3 and 9. The insulating layer 25B is located in the x1 direction with respect to the plurality of semiconductor elements 10B.

The pair of gate layers 26A and 26B has conductivity, and the constituent material thereof is, for example, Cu or a Cu alloy. As shown in FIG. 3, each of the pair of gate layers 26A and 26B has a strip shape extending in the y direction. The gate layer 26A is arranged on the insulating layer 25A, as shown in FIGS. 3 and 10. The gate layer 26A is electrically connected to the second electrode 112 (the gate electrode) of each semiconductor element 10A via the connecting member 51 (a gate wire 511 to be described later). The gate layer 26B is arranged on the insulating layer 25B, as shown in FIGS. 3 and 9. The gate layer 26B is electrically connected to the second electrode 112 (the gate electrode) of each semiconductor element 10B via the connecting member 51 (the gate wire 511 to be described later).

The pair of detection layers 27A and 27B has conductivity, and the constituent material thereof is, for example, Cu or a Cu alloy. As shown in FIG. 3, each of the pair of detection layers 27A and 27B has a strip shape extending in they direction. As shown in FIGS. 3 and 10, the detection layer 27A is arranged on the insulating layer 25A together with the gate layer 26A. The detection layer 27A is located on the insulating layer 25A next to the gate layer 26A and is separated from the gate layer 26A in a plan view. In the examples shown in FIGS. 3 and 10, the detection layer 27A is located in the x2 direction with respect to the gate layer 26A and is arranged farther than the gate layer 26A with respect to the plurality of semiconductor elements 10A. The arrangements of the gate layer 26A and the detection layer 27A in the x direction may be reversed. The detection layer 27A is electrically connected to the first electrode 111 (the source electrode) of each semiconductor element 10A via the connecting member 51 (a detection wire 512 to be described later). As shown in FIGS. 3 and 9, the detection layer 27B is arranged on the insulating layer 25B together with the gate layer 26B. The detection layer 27B is located on the insulating layer 25B next to the gate layer 26B and is separated from the gate layer 26B in a plan view. In the examples shown in FIGS. 3 and 9, the detection layer 27B is located in the x1 direction with respect to the gate layer 26B and is arranged farther than the gate layer 26B with respect to the plurality of semiconductor elements 10B. The arrangements of the gate layer 26B and the detection layer 27B in the x direction may be reversed. The detection layer 27B is electrically connected to the first electrode 111 (the source electrode) of each semiconductor element 10B via the connecting member 51 (the detection wire 512 to be described later).

[Intermediate Metal Layer 7]

As shown in FIGS. 3 and 9 to 19, the intermediate metal layer 7 is interposed between the semiconductor element 10 and the support substrate 20 in the z direction. The semiconductor element 10 and the intermediate metal layer 7 are bonded by solid phase diffusion bonding. Further, the intermediate metal layer 7 and the support substrate 20 are bonded by solid phase diffusion bonding. In the present embodiment, the plurality of intermediate metal layers 7 include the intermediate metal layer 7A and the intermediate metal layer 7B.

The intermediate metal layer 7A is interposed between the plurality of semiconductor elements 10A and the conductive member 24A of the support substrate 20. The intermediate metal layer 7A of the present embodiment includes a first layer 71A, a second layer 72A, and a third layer 73A. The first layer 71A is a layer made of a first metal and is a layer bonded to the back surface electrode 12 of each semiconductor element 10A by solid phase diffusion bonding. The thickness of the first layer 71A is not limited in any way and is, for example, 0.5 µm to 5.0 µm. In the illustrated example, it is, for example, about 2.0 µm.

The second layer 72A is a layer made of a second metal and is a layer bonded to the support surface layer 245A of the conductive member 24A of the support substrate 20 by solid phase diffusion bonding. The thickness of the second layer 72A is not limited in any way and is, for example, 0.5 µm to 5.0 µm. In the illustrated example, it is, for example, about 2.0 µm.

The third layer 73A is a layer interposed between the first layer 71A and the second layer 72A. The third layer 73A is made of a third metal. As the third metal, it is preferable to select metal softer than the first metal and the second metal. The third metal is, for example, Al, an Al alloy, or a Mg alloy. In addition, an underlayer or barrier layer (not shown) made of, for example, Ni, Ti, or the like may be provided between the third layer 73A and at least one of the first layer 71A and the second layer 72A. The thickness of the third layer 73A is not limited in any way and is, for example, 50 µm to 300 µm, specifically about 200 µm.

As shown in FIGS. 3, 11, 13, and 14, in the present embodiment, the intermediate metal layer 7A includes a plurality of first recesses 701A and second recesses 702A.

The plurality of first recesses 701A are formed on the side of the intermediate metal layer 7A where the first layer 71A is provided in the z direction. The first recesses 701A are recessed toward the second layer 72A in the z direction. In the illustrated example, the first recesses 701A are arranged side by side in the y direction when viewed along the z direction. The number of first recesses 701A corresponds to the number of semiconductor elements 10A and is four in the illustrated example. Each first recess 701A has a rectangular shape when viewed along the z direction. The semiconductor element 10A is bonded to the bottom of the first recess 701A by solid phase diffusion bonding. When viewed along the z direction, the semiconductor element 10A is included in the first recess 701A. A method of forming the first recess 701A is not limited in any way, and examples thereof may include laser processing and press processing using a mold. If the first recess 701A is formed by press processing after the first layer 71A is formed, cracks or the like may occur in the first layer 71A at the outer edge of the first recess 701A. The depth of the first recess 701A is not limited in any way and is, for example, 25 µm to 150 µm. When the thickness of the third layer 73A is 200 µm, the depth of the first recess 701A is about 100 µm. Further, a portion of the semiconductor element 10A protrudes from the first recess 701A in the z2 direction. When the thickness of the semiconductor element 10A in the z direction is 350 µm, the protruding height is, for example, about 250 µm, which is larger than ½ of the height of the semiconductor element 10A.

The inner surface of the first recess 701A constitutes a first facing surface 711A. In the present embodiment, since the first recess 701A has a rectangular shape, four first facing surfaces 711A are provided. Each first facing surface 711A faces the element facing surface 103 of the semiconductor element 10A. Portions where the first facing surface 711A and the element facing surface 103 face each other are engaged with each other to form the first positioning portion 81. The first positioning portion 81 is provided to suppress the relative movement of the semiconductor element 10A and the intermediate metal layer 7A. In the present embodiment, the relative movement in the x direction and the y direction is suppressed by the first positioning portion 81.

The second recess 702A is formed on the side of the intermediate metal layer 7A where the second layer 72A is provided in the z direction. The second recess 702A is recessed toward the first layer 71A in the x direction. In the illustrated example, the second recess 702A is formed by forming both ends of the intermediate metal layer 7A in the y direction so as to protrude to the opposite side of the semiconductor element 10A in the z direction.

The inner surface of the second recess 702A constitutes a second facing surface 712A. As shown in FIG. 14, the second facing surface 712A is a surface facing inward in the y direction and faces the substrate facing surface 213A. Portions where the second facing surface 712A and the substrate facing surface 213A face each other are engaged with each other to form the second positioning portion 82. The second positioning portion 82 is provided to suppress the relative movement of the intermediate metal layer 7A and the conductive member 24A of the support substrate 20. In the present embodiment, the relative movement in the x direction is suppressed by the second positioning portion 82. In the present embodiment, two second facing surfaces 712A are provided on both sides of the intermediate metal layer 7A in the x direction. As a result, two second positioning portions 82 are provided for the intermediate metal layer 7A.

The intermediate metal layer 7B is interposed between the plurality of semiconductor elements 10B and the conductive member 24B of the support substrate 20. The intermediate metal layer 7B of the present embodiment includes a first layer 71B, a second layer 72B, and a third layer 73B. The first layer 71B is a layer made of a first metal and is a layer bonded to the back surface electrode 12 of each semiconductor element 10B by solid phase diffusion bonding. The thickness of the first layer 71B is not limited in any way and is, for example, 0.5 µm to 5.0 µm. In the illustrated example, it is, for example, about 2.0 µm.

The second layer 72B is a layer made of a second metal and is a layer bonded to the support surface layer 245B of the conductive member 24B of the support substrate 20 by solid phase diffusion bonding. The thickness of the second layer 72B is not limited in any way and is, for example, 0.5 µm to 5.0 µm. In the shown example, it is, for example, about 2.0 µm.

The third layer 73B is a layer interposed between the first layer 71B and the second layer 72B. The third layer 73B is made of a third metal. In addition, an underlayer or barrier layer (not shown) made of, for example, Ni, Ti, or the like may be provided between the third layer 73B and at least one of the first layer 71B and the second layer 72B. The thickness of the third layer 73B is not limited in any way and is, for example, 50 μm to 300 μm, specifically about 200 μm.

As shown in FIGS. 3, 11, 15, and 16, in the present embodiment, the intermediate metal layer 7B has a plurality of first recesses 701B and second recesses 702B.

The plurality of first recesses 701B are formed on the side of the intermediate metal layer 7B where the first layer 71B is provided in the z direction. The first recesses 701B are recessed toward the second layer 72B in the z direction. In the illustrated example, the first recesses 701B are arranged side by side in the y direction when viewed along the z direction. The number of first recesses 701B corresponds to the number of semiconductor elements 10B and is four in the illustrated example. Each first recess 701B has a rectangular shape when viewed along the z direction. The semiconductor element 10B is bonded to the bottom of the first recess 701B by solid phase diffusion bonding. When viewed along the z direction, the semiconductor element 10B is included in the first recess 701B. A method of forming the first recess 701B is not limited in any way, and examples thereof may include laser processing and press processing using a mold. If the first recess 701B is formed by press processing after the first layer 71B is formed, cracks or the like may occur in the first layer 71B at the outer edge of the first recess 701B. The depth of the first recess 701B is not limited in any way and is, for example, 25 μm to 150 μm. When the thickness of the third layer 73B is 200 μm, the depth of the first recess 701B is about 100 μm. Further, a portion of the semiconductor element 10B protrudes from the first recess 701B in the z2 direction. When the thickness of the semiconductor element 10B in the z direction is 350 μm, the protruding height is, for example, about 250 μm, which is larger than ½ of the height of the semiconductor element 10B.

The inner surface of the first recess 701B constitutes a first facing surface 711B. In the present embodiment, since the first recess 701B has a rectangular shape, four first facing surfaces 711B are provided. Each first facing surface 711B faces the element facing surface 103 of the semiconductor element 10B. Portions where the first facing surface 711B and the element facing surface 103 face each other are engaged with each other to form the first positioning portion 81. The first positioning portion 81 is provided to suppress the relative movement of the semiconductor element 10B and the intermediate metal layer 7B. In the present embodiment, the relative movement in the x direction and the y direction is suppressed by the first positioning portion 81.

The second recess 702B is formed on the side of the intermediate metal layer 7B where the second layer 72B is provided in the z direction. The second recess 702B is recessed toward the first layer 71B in the x direction. In the illustrated example, the second recess 702B is formed by forming both ends of the intermediate metal layer 7B in the y direction so as to protrude to the opposite side of the semiconductor element 10B in the z direction.

The inner surface of the second recess 702B constitutes a second facing surface 712B. As shown in FIG. 14, the second facing surface 712B is a surface facing inward in the y direction and faces the substrate facing surface 213B. Portions where the second facing surface 712B and the substrate facing surface 213B face each other are engaged with each other to form the second positioning portion 82.

The second positioning portion 82 is provided to suppress the relative movement of the intermediate metal layer 7B and the conductive member 24B of the support substrate 20. In the present embodiment, the relative movement in the x direction is suppressed by the second positioning portion 82. In the present embodiment, two second facing surfaces 712B are provided on both sides of the intermediate metal layer 7B in the x direction. As a result, two second positioning portions 82 are provided for the intermediate metal layer 7B.

[Input Terminals 31 and 32]

The two input terminals 31 and 32 are metal plates, respectively. The constituent material of each metal plate is Cu or a Cu alloy. Both of the two input terminals 31 and 32 have a dimension of, for example, about 0.8 mm in the z direction, but are not limited thereto. Both of the two input terminals 31 and 32 are located closer to the x2 direction in the semiconductor device A1, as shown in FIGS. 1, 3, 9, and 10. For example, a power supply voltage is applied between the two input terminals 31 and 32. The power supply voltage may be directly applied to the input terminals 31 and 32 from a power supply (not shown), or may be applied to the input terminals 31 and 32 via a bus bar (not shown) connected so as to sandwich the input terminals 31 and 32. Further, a snubber circuit or the like may be connected in parallel. The input terminal 31 is a positive electrode (P terminal), and the input terminal 32 is a negative electrode (N terminal). The input terminal 32 is arranged apart from both the input terminal 31 and the support substrate 20 (the conductive member 24A) in the z direction.

The input terminal 31 includes a pad portion 311 and a terminal portion 312, as shown in FIGS. 3 and 9.

The pad portion 311 is a portion of the input terminal 31 covered with the sealing member 60. In the example shown in FIG. 3, the end portion of the pad portion 311 on the x1 direction side has a comb-tooth shape in a plan view, but may have a rectangular shape in a plan view instead of the comb-tooth shape. The comb-shaped portion of the pad portion 311 is conductively bonded to the conductive member 24A (the metal layer 242A). The bonding between the pad portion 311 and the conductive member 24A may be one of laser bonding, ultrasonic bonding, and bonding using a conductive bonding material.

The terminal portion 312 is a portion of the input terminal 31 exposed from the sealing member 60. As shown in FIGS. 3, 5, 6, 8, and 9, the terminal portion 312 extends from the sealing member 60 in the x2 direction in a plan view.

The input terminal 32 includes a pad portion 321 and a terminal portion 322, as shown in FIGS. 3 and 9.

The pad portion 321 is a portion of the input terminal 32 covered with the sealing member 60. As shown in FIG. 3, the pad portion 321 includes a connecting portion 321a and a plurality of extending portions 321b. The connecting portion 321a has a strip shape extending in the y direction. The connecting portion 321a is connected to the terminal portion 322. The plurality of extending portions 321b have a strip shape extending from the connecting portion 321a in the x1 direction. The plurality of extending portions 321b are separated from each other and are lined up in the y direction in a plan view. The tip portion of each extending portion 321b overlaps each base portion 41 in a plan view and is bonded to each base portion 41. The bonding may be laser welding using laser light, ultrasonic bonding, or bonding using a bonding material. The tip portion is an end edge portion on the x1 direction side of the extending portion 321b that is opposite to the side connected to the connecting portion 321a in the x direction.

The terminal portion 322 is a portion of the input terminal 32 exposed from the sealing member 60. As shown in FIGS. 2, 3, and 6, the terminal portion 322 extends from the sealing member 60 in the x2 direction in a plan view. The terminal portion 322 has a rectangular shape in a plan view. As shown in FIGS. 2, 3, and 6, the terminal portion 322 overlaps the terminal portion 312 of the input terminal 31 in a plan view. The terminal portion 322 is separated from the terminal portion 312 in the z2 direction. The shape of the terminal portion 322 is the same as the shape of, for example, the terminal portion 312.

The output terminal 33 is a metal plate. The constituent material of the metal plate is, for example, Cu or a Cu alloy. As shown in FIGS. 1, 2, 3, 5, 6, and 9, the output terminal 33 is located closer to the x1 direction in the semiconductor device A1. AC power (voltage) power-converted by the plurality of semiconductor elements 10 is output from the output terminal 33.

As shown in FIGS. 3 and 9, the output terminal 33 includes a pad portion 331 and a terminal portion 332.

The pad portion 331 is a portion of the output terminal 33 covered with the sealing member 60. In the example shown in FIG. 3, a portion of the pad portion 331 on the x2 direction side has a comb-tooth shape in a plan view, but may have a rectangular shape in a plan view instead of the comb-tooth shape. The comb-shaped portion of the pad portion 331 is conductively bonded to the conductive member 24B (the metal layer 242B). The bonding between the pad portion 331 and the conductive member 24B may be laser bonding, ultrasonic bonding, or bonding using a conductive bonding material.

The terminal portion 332 is a portion of the output terminal 33 exposed from the sealing member 60. As shown in FIGS. 2, 3, 5, 6, 9, and 10, the terminal portion 332 extends from the sealing member 60 in the x1 direction.

As shown in FIG. 3, the pair of gate terminals 34A and 34B is located next to the respective conductive members 24A and 24B in the y direction. A gate voltage for driving the plurality of semiconductor elements 10A is applied to the gate terminal 34A. A gate voltage for driving the plurality of semiconductor elements 10B is applied to the gate terminal 34B.

As shown in FIG. 3, the pair of detection terminals 35A and 35B is located next to the pair of gate terminals 34A and 34B in the x direction. A voltage (voltage corresponding to a source current) applied to each main surface electrode 11 (the first electrode 111) of the plurality of semiconductor elements 10A is detected from the detection terminal 35A. A voltage (voltage corresponding to a source current) applied to each main surface electrode 11 (the first electrode 111) of the plurality of semiconductor elements 10B is detected from the detection terminal 35B.

As shown in FIG. 3, a plurality of dummy terminals 36 are located on the opposite side of the pair of detection terminals 35A and 35B from the pair of gate terminals 34A and 34B in the x direction. In the semiconductor device A1, the number of dummy terminals 36 is six. Of these, three dummy terminals 36 are located on one side (the x2 direction) in the x direction. The remaining three dummy terminals 36 are located on the other side (the x1 direction) in the x direction. The number and arrangement of dummy terminals 36 are not limited to the above configuration. The plurality of dummy terminals 36 may not be provided.

As shown in FIGS. 1 to 5 and 6, the pair of gate terminals 34A and 34B, the pair of detection terminals 35A and 35B, and the plurality of dummy terminals 36 are arranged along the x direction in a plan view. In the semiconductor device A1, the pair of gate terminals 34A and 34B, the pair of detection terminals 35A and 35B, and the plurality of dummy terminals 36 are all formed from the same lead frame.

An insulating plate 39 has an electrical insulating property, and the constituent material thereof is, for example, insulating paper. A portion of the insulating plate 39 is a flat plate and is sandwiched between the terminal portion 312 of the input terminal 31 and the terminal portion 322 of the input terminal 32 in the z direction, as shown in FIGS. 3, 5, 8, 9, and 10. In a plan view, the input terminal 31 entirely overlaps the insulating plate 39. Further, in a plan view, in the input terminal 32, a portion of the pad portion 321, and the entire terminal portion 322 overlap the insulating plate 39. The two input terminals 31 and 32 are insulated from each other by the insulating plate 39. A portion of the insulating plate 39 (the portion on the x1 direction side) is covered with the sealing member 60.

As shown in FIG. 9, the insulating plate 39 includes an interposing portion 391 and an extending portion 392. The interposing portion 391 is interposed between the terminal portion 312 of the input terminal 31 and the terminal portion 322 of the input terminal 32 in the z direction. The entire interposing portion 391 is sandwiched between the terminal portion 312 and the terminal portion 322. The extending portion 392 extends from the interposing portion 391 further than the terminal portion 312 and the terminal portion 322 in the x2 direction.

[Base Portion 41]

Each of the plurality of base portions 41 has electrical insulating property, and the constituent material thereof is, for example, ceramics. As shown in FIG. 9, each base portion 41 is bonded to the surface of the conductive member 24A. Each base portion 41 has, for example, a rectangular shape in a plan view. The plurality of base portions 41 are lined up in the y direction and are separated from each other. The dimension of each base portion 41 in the z direction is substantially the same as the sum of the dimension of the input terminal 31 in the z direction and the dimension of the insulating plate 39 in the z direction. Each extending portion 321b of the pad portion 321 of the input terminal 32 is bonded to each base portion 41. Each base portion 41 supports the input terminal 32 so that the input terminal 32 is substantially parallel to the support substrate 20.

[Connecting Member 51]

The plurality of connecting members 51 are so-called bonding wires. Each of the plurality of connecting members 51 has conductivity, and the constituent material thereof is, any of, for example, Al, Cu, Au, a clad material, and an alloy having one or more of these. As shown in FIG. 3, the plurality of connecting members 51 include a plurality of gate wires 511, a plurality of detection wires 512, a pair of first connecting wires 513, and a pair of second connecting wires 514.

As shown in FIG. 3, each of the plurality of gate wires 511 is bonded to the second electrode 112 (the gate electrode) of each semiconductor element 10 and to any of the pair of gate layers 26A and 26B. The plurality of gate wires 511 include one that electrically connects the second electrode 112 of each semiconductor element 10A and the gate layer 26A, and one that electrically connects the second electrode 112 of each semiconductor element 10B and the gate layer 26B.

As shown in FIGS. 3, 9, and 10, each of the plurality of detection wires 512 is bonded to the first electrode 111 (the source electrode) of each semiconductor element 10 and to any of the pair of detection layers 27A and 27B. The plurality of detection wires 512 include one that electrically connects the first electrode 111 of each semiconductor element 10A and the detection layer 27A, and one that electrically connects the first electrode 111 of each semiconductor element 10B and the detection layer 27B.

As shown in FIG. 3, one of the pair of first connecting wires 513 electrically connects the gate layer 26A and the gate terminal 34A, and the other thereof electrically connects the gate layer 26B and the gate terminal 34B. The one first connecting wire 513 is bonded to the gate layer 26A and the pad portion 341 of the gate terminal 34A. The other first connecting wire 513 is connected to the gate layer 26B and the pad portion 341 of the gate terminal 34B.

As shown in FIG. 3, one of the pair of second connecting wires 514 electrically connects the detection layer 27A and the detection terminal 35A, and the other thereof electrically connects the detection layer 27B and the insulating layer 25B. The one second connecting wire 514 is bonded to the detection layer 27A and the pad portion 351 of the detection terminal 35A. The other second connecting wire 514 is bonded to the detection layer 27B and the pad portion 351 of the detection terminal 35B.

[Connecting Member 52]

Each of the plurality of connecting members 52 has conductivity, and the constituent material thereof is, any of, for example, Al, Cu, Au, a clad material, and an alloy having one or more of these. In the present embodiment, the plurality of connecting members 52 include a plurality of first main wires 521 and a plurality of second main wires 522. The connecting members 52 are not limited to the wires, but may be, for example, plate-shaped connecting members formed of metal plates.

As shown in FIGS. 3 and 10, each of the plurality of first main wires 521 electrically connects each semiconductor element 10A and the conductive member 24B. Each first main wire 521 is bonded to the first electrode 111 (the source electrode) of each semiconductor element 10A and the metal layer 242B of the conductive member 24B. In the illustrated example, two first main wires 521 are bonded to the first electrode 111 of one semiconductor element 10A, but this is an example, and the number of first main wires 521 is not limited in any way.

As shown in FIGS. 3 and 9, each of the plurality of second main wires 522 connects each semiconductor element 10B and the input terminal 32. Each second main wire 522 is bonded to the first electrode 111 (the source electrode) of each semiconductor element 10B and each extending portion 321b of the pad portion 321 of the input terminal 32. In the shown example, two second main wires 522 are bonded to the first electrode 111 of one semiconductor element 10B, but this is an example, and the number of second main wires 522 is not limited in any way.

[Sealing Member 60]

As shown in FIGS. 1 and 2 to 15, the sealing member 60 covers the plurality of semiconductor elements 10, a portion of the support substrate 20, a portion of the two input terminals 31 and 32, a portion of the output terminal 33, a portion of the pair of gate terminals 34A and 34B, a portion of the pair of detection terminals 35A and 35B, a portion of the plurality of dummy terminals 36, the plurality of base portions 41, the plurality of connecting members 51, the plurality of connecting members 52, and the intermediate metal layers 7A and 7B. The constituent material of the sealing member 60 is an insulating resin material, for example, an epoxy resin. The sealing member 60 can be formed, for example, by transfer molding. The dimension of the sealing member 60 in the z direction is, for example, about 10 mm. As shown in FIGS. 1, 2, 10, 13, and 15, the sealing member 60 includes a resin main surface 61, a resin back surface 62, and a plurality of resin side surfaces 631 to 634.

The resin main surface 61 and the resin back surface 62 are separated from each other in the z direction, as shown in FIGS. 5, 7 to 10, 13, and 15. The resin main surface 61 faces the z1 direction, and the resin back surface 62 faces the z2 direction. As shown in FIG. 6, the resin back surface 62 has a frame shape surrounding the pair of back surface metal layers 23A and 23B in a plan view. The plurality of resin side surfaces 631 to 634 are each connected to both the resin main surface 61 and the resin back surface 62, and are sandwiched between them in the z direction. As shown in FIGS. 2, 3, 5, 6, 9, and 10, the two resin side surfaces 631 and 632 are separated from each other in the x direction. The resin side surface 631 faces the x1 direction, and the resin side surface 632 faces the x2 direction. As shown in FIGS. 2, 3, 6 to 8, 13, and 15, the two resin side surfaces 633 and 634 are separated from each other in they direction. The resin side surface 633 faces the y1 direction, and the resin side surface 634 faces the y2 direction.

In a method of manufacturing the semiconductor device A1, as shown in FIGS. 18 and 19, the intermediate metal layer 7A is placed on the conductive member 24A of the support substrate 20. At this time, the substrate facing surface 213A and the second facing surface 712A face each other to form the second positioning portion 82. Similarly, the intermediate metal layer 7B is placed on the conductive member 24B of the support substrate 20. At this time, the substrate facing surface 213B and the second facing surface 712B face each other to form the second positioning portion 82. Further, the plurality of semiconductor elements 10A are placed on the plurality of first recesses 701A of the intermediate metal layer 7A. At this time, the element facing surface 103 and the first facing surface 711A face each other to form the first positioning portion 81. Further, the plurality of semiconductor elements 10B are placed on the plurality of first recesses 701B of the intermediate metal layer 7B. At this time, the element facing surface 103 and the first facing surface 711B face each other to form the first positioning portion 81. Then, pressure treatment and heat treatment are performed in which the semiconductor element 10A, the intermediate metal layer 7A, and the conductive member 24A (the support substrate 20) are pressed against each other, and the semiconductor element 10B, the intermediate metal layer 7B, and the conductive member 24B (the support substrate 20) are pressed against each other. As a result, the first layers 71A and 71B and the back surface electrodes 12 of the semiconductor elements 10A and 10B are bonded by solid phase diffusion bonding. Further, the second layers 72A and 72B and the support surface layers 245A and 245B are bonded by solid phase diffusion bonding.

The operations and effects of the semiconductor device A1 according to the first embodiment are as follows.

As shown in FIGS. 11, 12, 14, and 16, the semiconductor device A1 includes the first positioning portion 81. The first positioning portion 81 suppresses the relative movement of the semiconductor elements 10A and 10B and the intermediate metal layers 7A and 7B. Therefore, for example, at the time of manufacturing the semiconductor device A1, after mounting the semiconductor elements 10A and 10B on the intermediate metal layers 7A and 7B, it is possible to prevent the semiconductor elements 10A and 10B from being improperly displaced with respect to the intermediate metal layers 7A and 7B until the semiconductor elements 10A and 10B (the back surface electrodes 12) and the intermediate metal layers 7A and 7B (the first layers 71A and 71B) are bonded to each other by solid phase diffusion bonding. Therefore, according to the semiconductor device A1, the displacement of the semiconductor elements can be suppressed.

The first positioning portion 81 is configured by engaging the element facing surfaces 103 of the semiconductor elements 10A and 10B and the first facing surfaces 711A and 711B of the intermediate metal layers 7A and 7B with each other. Therefore, it is not necessary to provide, for example, an adhesive for temporarily fixing between the back surface electrodes 12 and the first layers 71A and 71B. As a result, impurities that may exist between the back surface electrodes 12 and the first layers 71A and 71B can be reduced, thereby more reliably performing solid phase diffusion bonding.

The first facing surfaces 711A and 711B are composed of the inner surfaces of the first recesses 701A and 701B. Further, the semiconductor elements 10A and 10B are contained in the first recesses 701A and 701B when viewed along the z direction, and a portion of each of the semiconductor elements 10A and 10B is accommodated in each of the first recesses 701A and 701B. As a result, it is possible to prevent the semiconductor elements 10A and 10B from moving in both the x direction and the y direction with respect to the intermediate metal layers 7A and 7B.

Portions of the semiconductor elements 10A and 10B protrude from the first recesses 701A and 701B in the z2 direction, respectively. The intermediate metal layers 7A and 7B are electrically connected to the back electrodes 12 of the semiconductor elements 10A and 10B, respectively, while being insulated from the first electrode 111 and the second electrode 112, respectively. By protruding the semiconductor elements 10A and 10B, it is possible to prevent the intermediate metal layers 7A and 7B from being improperly connected electrically to the first electrode 111 and the second electrode 112, respectively. Further, in order to avoid such electrical connection, it is preferable to protrude ½ or more of the thickness of the semiconductor elements 10A and 10B in the z direction.

As shown in FIGS. 13 to 18, the semiconductor device A1 includes the second positioning portion 82. The second positioning portion 82 suppresses the relative movement between the support substrate 20 and the intermediate metal layers 7A and 7B. Therefore, for example, at the time of manufacturing the semiconductor device A1, after mounting the intermediate metal layers 7A and 7B on the support substrate 20 (the conductive members 24A and 24B), it is possible to prevent the intermediate metal layers 7A and 7B from being improperly displaced with respect to the support substrate 20 until the support substrate 20 (the support surface layers 245A and 245B) and the intermediate metal layers 7A and 7B (the second layers 72A and 72B) are bonded to each other by solid phase diffusion bonding. Therefore, the displacement of the semiconductor elements can be further suppressed.

The second positioning portion 82 is configured by engaging the substrate facing surfaces 213A of the support substrate 20 (the conductive members 24A and 24B) and the second facing surfaces 712A and 712B of the intermediate metal layers 7A and 7B with each other.

Therefore, it is not necessary to provide, for example, an adhesive for temporarily fixing between the second layers 72A and 72B and the support surface layers 245A and 245B. As a result, impurities that may exist between the second layers 72A and 72B and the support surface layers 245A and 245B can be reduced, thereby more reliably performing solid phase diffusion bonding.

The second recesses 702A and 702B are formed in the intermediate metal layers 7A and 7B, respectively. The second recesses 702A and 702B are arranged so as to cross the conductive members 24A and 24B in the x direction, respectively. Therefore, four semiconductor elements 10A and 10B are arranged on each of the intermediate metal layers 7A and 7B. This has an advantage that the manufacturing efficiency can be improved over a configuration in which a plurality of intermediate metal layers 7A and 7B are individually facilitated for each of the four semiconductor elements 10A and 10B.

The first layers 71A and 71B of the intermediate metal layers 7A and 7B and the back electrodes 12 of the semiconductor elements 10A and 10B are formed of the same first metal. This is preferable for solid phase diffusion bonding between the first layers 71A and 71B of the intermediate metal layers 7A and 7B and the back electrodes 12 of the semiconductor elements 10A and 10B. Further, selecting Ag as the first metal is advantageous for more reliable solid phase diffusion bonding.

The second layers 72A and 72B of the intermediate metal layers 7A and 7B and the support surface layers 245A and 245B of the support substrate 20 are formed of the same second metal. This is preferable for solid phase diffusion bonding between the second layers 72A and 72B of the intermediate metal layers 7A and 7B and the support surface layers 245A and 245B of the support substrate 20. Further, selecting Ag as the second metal is advantageous for more reliable solid phase diffusion bonding.

The intermediate metal layers 7A and 7B include the third layers 73A and 73B interposed between the first layers 71A and 71B and the second layers 72A and 72B, respectively. The third layers 73A and 73B are made of the third metal softer than the first metal of the first layers 71A and 71B and the second metal of the second layers 72A and 72B. As a result, when the semiconductor elements 10A and 10B, the intermediate metal layers 7A and 7B, and the conductive members 24A and 24B (the support substrate 20) are collectively pressure-treated and heat-treated so that they are bonded to each other by solid-phase diffusion bonding, the third layers 73A and 73B function as buffer layers. As a result, for example, it is possible to suppress a situation in which the semiconductor elements 10A and 10B are unintentionally tilted to prevent properly performing the solid phase diffusion bonding. When the first metal and the second metal are Ag, it is preferable to select Al as the third metal in order to enhance such an effect. Further, it is desirable that the thickness of the third layers 73A and 73B is thicker than that of the first layers 71A and 71B and the second layers 72A and 72B in order to improve the buffer function.

FIGS. 20 to 26 show other embodiments and modifications thereof of the present disclosure. In these figures, the same or similar elements as those in the above embodiment are denoted by the same reference numerals as those in the above embodiment.

Second Embodiment

Figure 20:
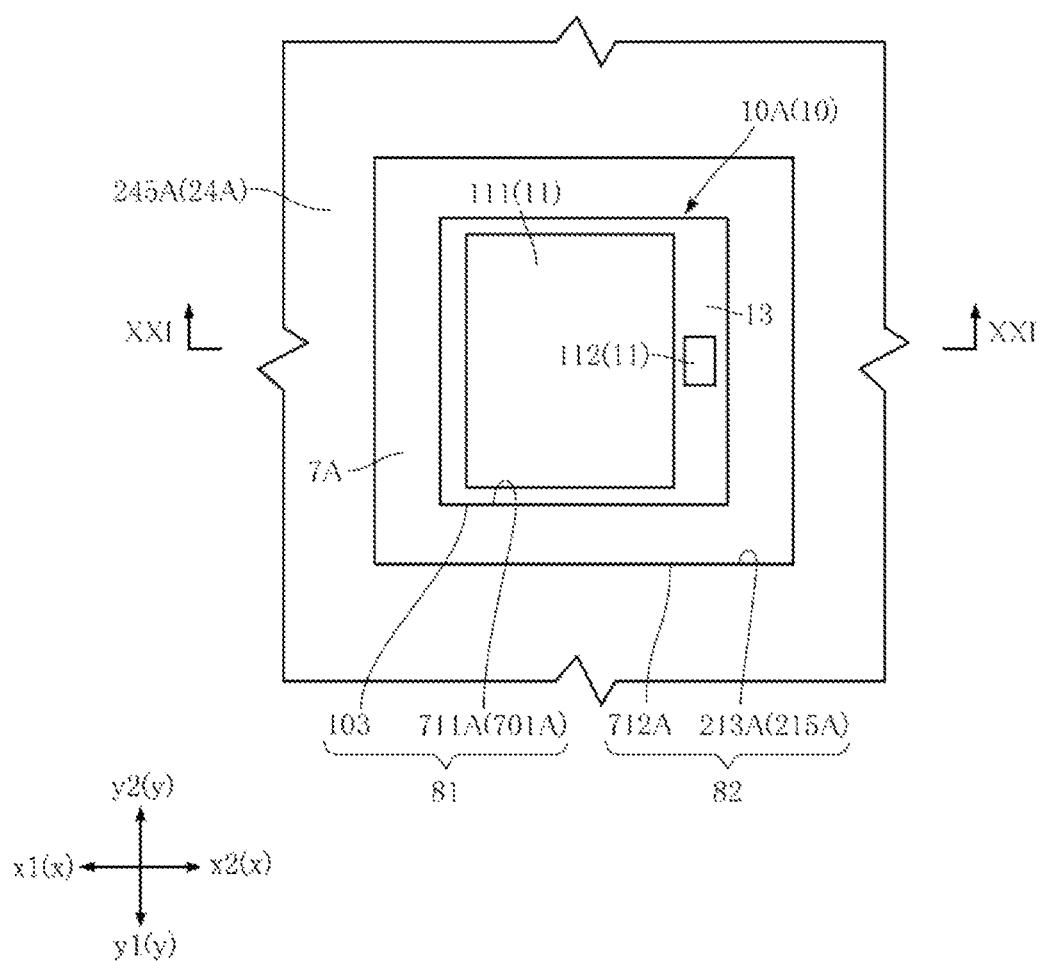
FIG. 20 is an enlarged main part plan view showing a semiconductor device according to a second embodiment of the present disclosure.
Figure 21:
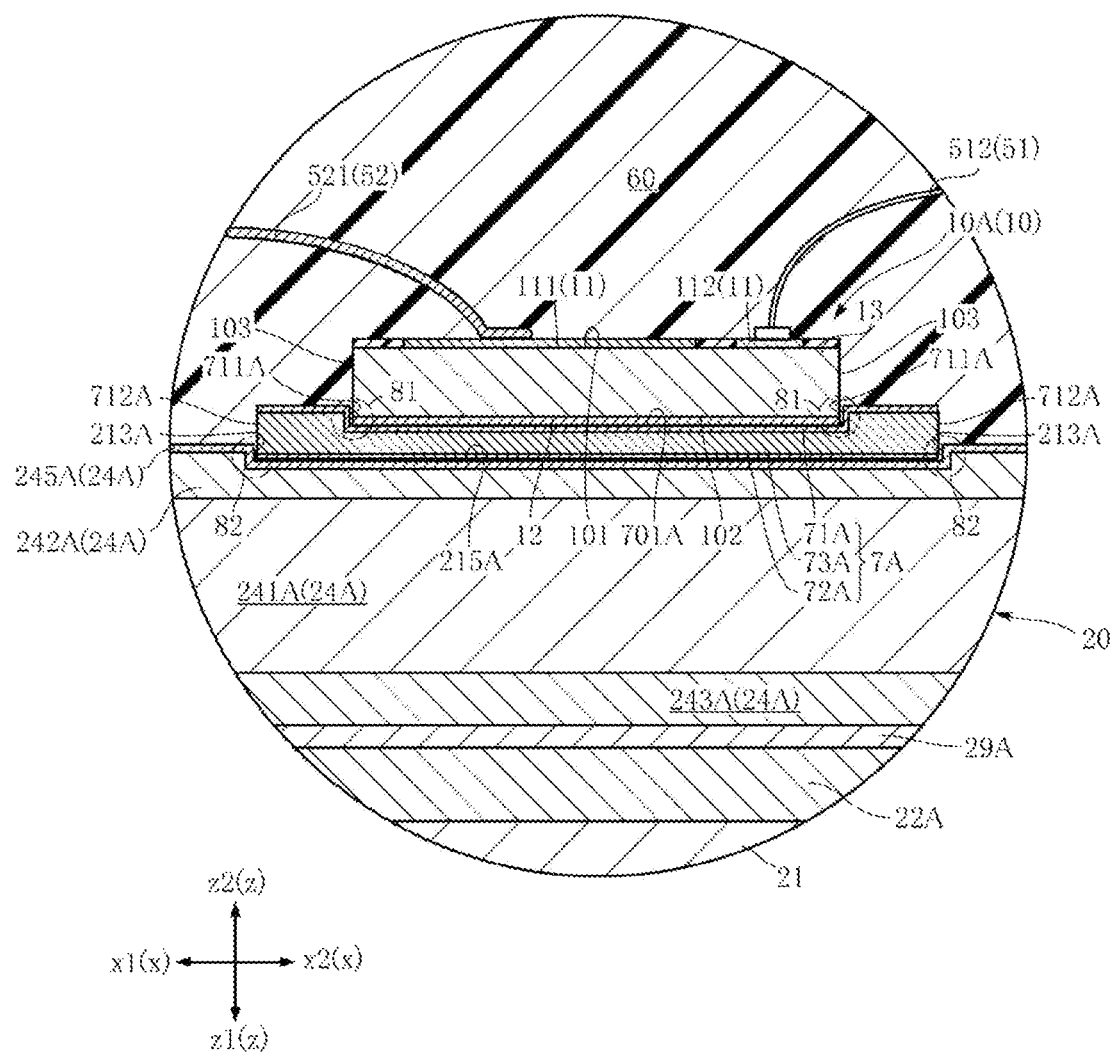
FIG. 21 is an enlarged main part cross-sectional view taken along line XXI-XXI in FIG. 20.

FIGS. 20 and 21 show a semiconductor device according to a second embodiment of the present disclosure. In the semiconductor device A2 of the second embodiment, the configurations of the intermediate metal layer 7 and the support substrate 20 are different from those of the above-described embodiment. Although FIGS. 20 and 21 show the semiconductor element 10A, the intermediate metal layer 7A, and the conductive member 24A, the semiconductor element 10B, the intermediate metal layer 7B, and the conductive member 24B of the second embodiment have the same configurations as the semiconductor element 10A, the intermediate metal layer 7A, and the conductive member 24A, respectively, unless otherwise stated.

The intermediate metal layer 7A of the second embodiment includes the first recess 701A and does not include the second recess 702A of the above-described embodiment. The intermediate metal layer 7A has a rectangular shape when viewed along the z direction and includes four second facing surfaces 712A. The second facing surface 712A is a surface facing outward in the x direction or the y direction. Further, one intermediate metal layer 7A is provided for one semiconductor element 10A. That is, in the second embodiment, the number of semiconductor elements 10A is equal to the number of intermediate metal layers 7A.

The substrate recess 215A is formed in the conductive member 24A. The substrate recess 215A is recessed in the z direction from the metal layer 242A toward the insulating substrate 21. In the illustrated example, the substrate recess 215A has a rectangular shape when viewed along the z direction. The inner surface of the substrate recess 215A constitutes the substrate facing surface 213A. The inner surface thereof includes four substrate facing surfaces 213A. When viewed along the z direction, the intermediate metal layer 7A is contained in the substrate recess 215A. Portions where the substrate facing surface 213A and the second facing surface 712A face each other constitute the second positioning portion 82 of the second embodiment.

Also in the second embodiment, the displacement of the semiconductor elements 10A and 10B can be suppressed. Further, according to the second positioning portion 82 of the second embodiment, it is possible to suppress the relative movement of the intermediate metal layers 7A and 7B with respect to the support substrate 20 (the conductive members 24A and 24B) in the x direction and the y direction. This is preferable for suppressing the displacement of the semiconductor elements 10A and 10B.

<First Modification of Second Embodiment>

Figure 22:
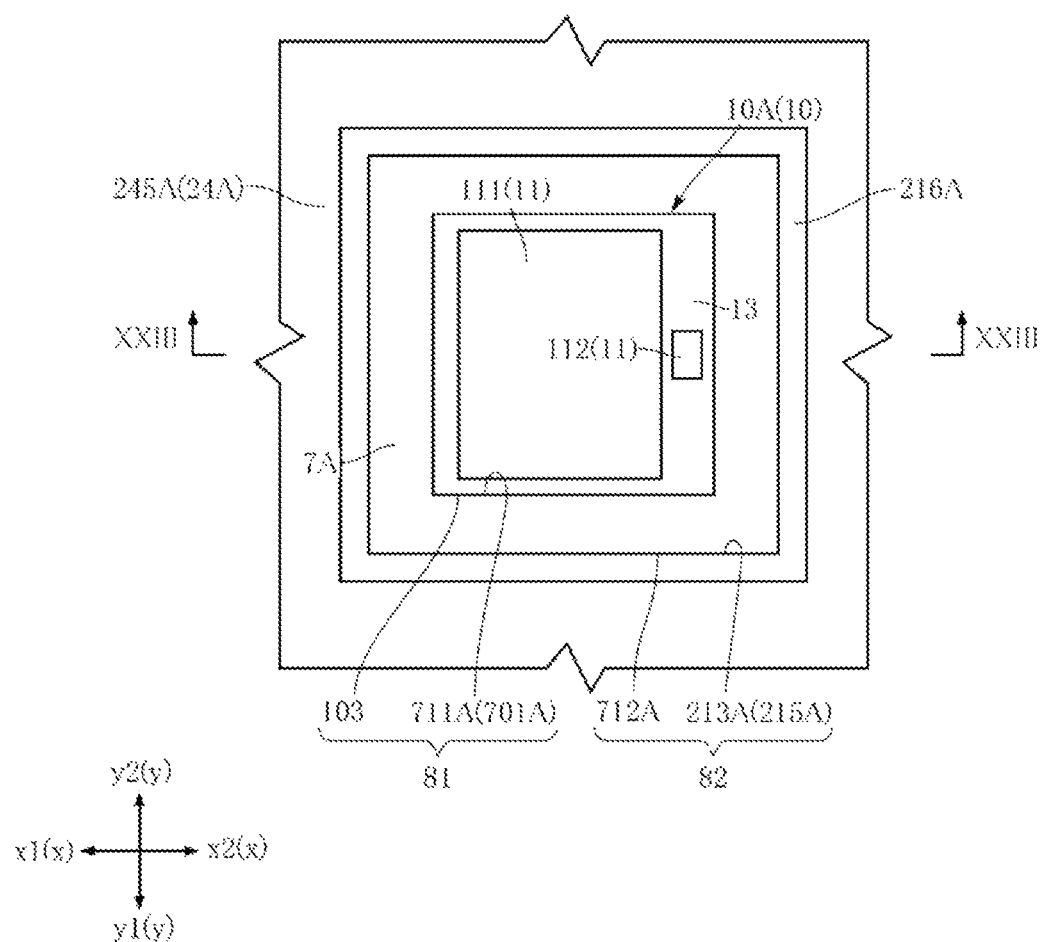
FIG. 22 is an enlarged main part plan view showing a first modification of the semiconductor device according to the second embodiment of the present disclosure.
Figure 23:
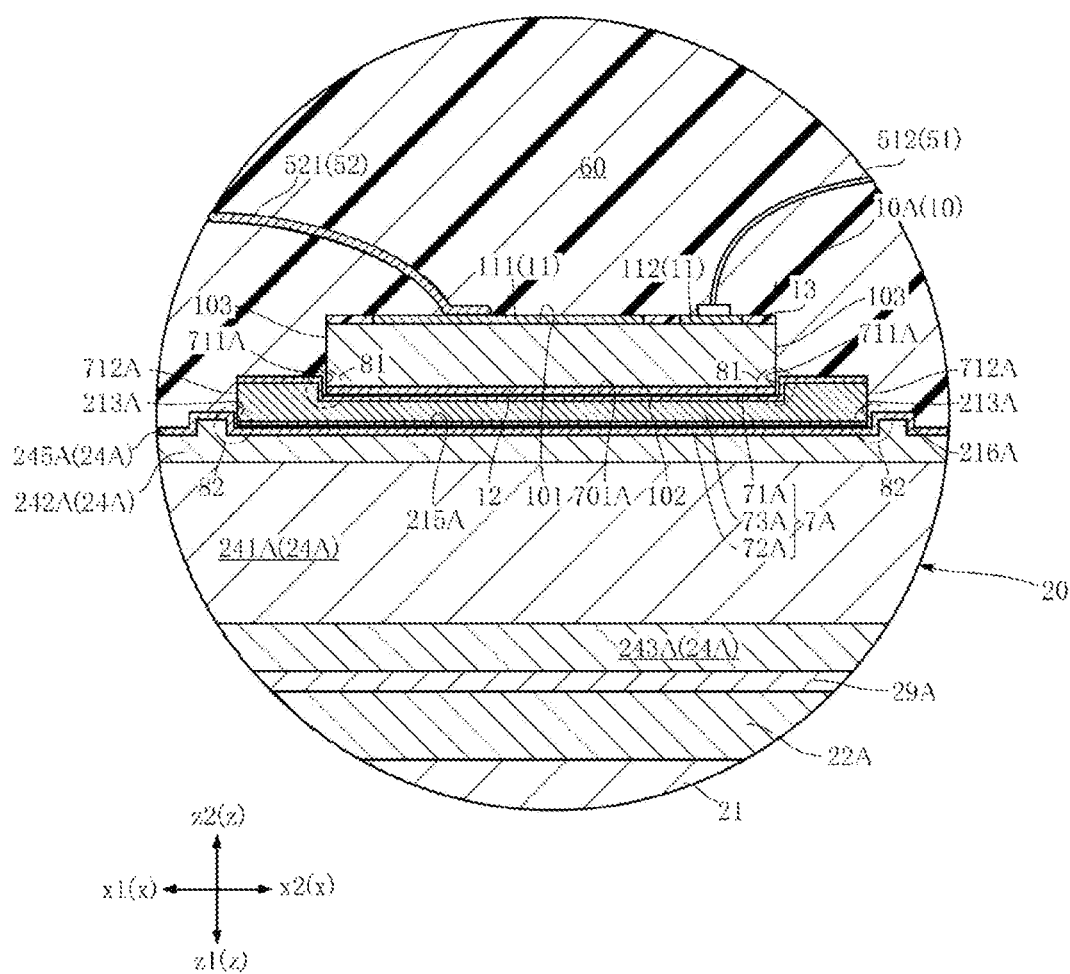
FIG. 23 is an enlarged main part cross-sectional view taken along line XXIII-XXIII of FIG. 22.

FIGS. 22 and 23 show a first modification of the semiconductor device A2. A semiconductor device A21 of the first modification is different from that of the above-described embodiment in the configuration of the support substrate 20 (the conductive member 24A). Although FIGS. 22 and 23 show the semiconductor element 10A, the intermediate metal layer 7A, and the conductive member 24A, they have the same configurations as the semiconductor element 10B, the intermediate metal layer 7B, and the conductive member 24B of the first modification, respectively, unless otherwise stated.

The conductive member 24A of the first modification includes a substrate protruding portion 216A. The substrate protruding portion 216A is a portion that protrudes from the conductive member 24A on the side opposite to the insulating substrate 21 in the z direction. The substrate protruding portion 216A has a rectangular annular shape when viewed along the z direction. By forming the substrate protruding portion 216A, the substrate recess 215A is provided in the conductive member 24A. Similar to the semiconductor device A2, the inner surface of the substrate recess 215A constitutes the substrate facing surface 213A.

Also in the first modification, the displacement of the semiconductor elements 10A and 10B can be suppressed. Further, as can be understood from the first modification, the detailed geometrical shapes of the semiconductor elements 10A and 10B, the intermediate metal layers 7A and 7B, and the conductive members 24A and 24B constituting the first positioning portion 81 and the second positioning portion 82 are not limited in any way.

Third Embodiment

Figure 24:
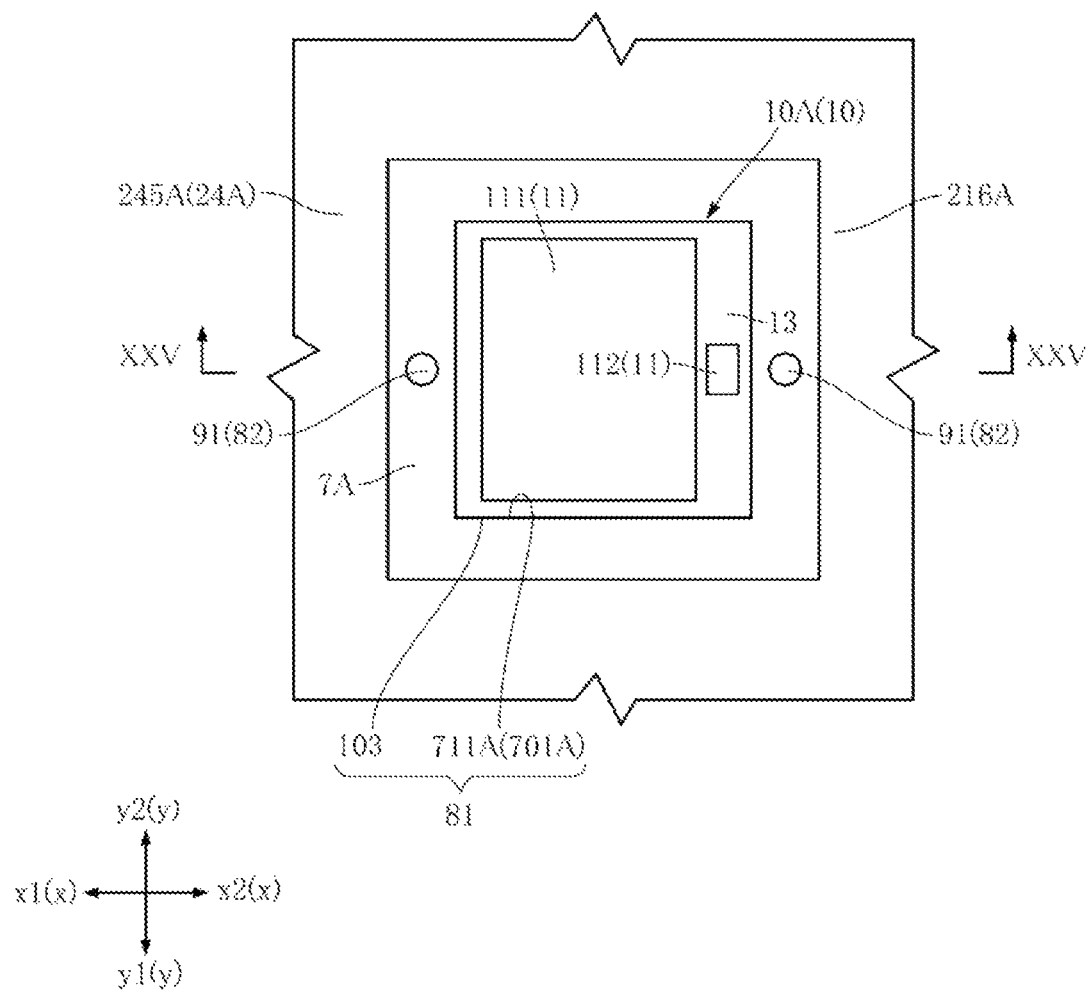
FIG. 24 is an enlarged main part plan view showing a semiconductor device according to a third embodiment of the present disclosure.
Figure 25:
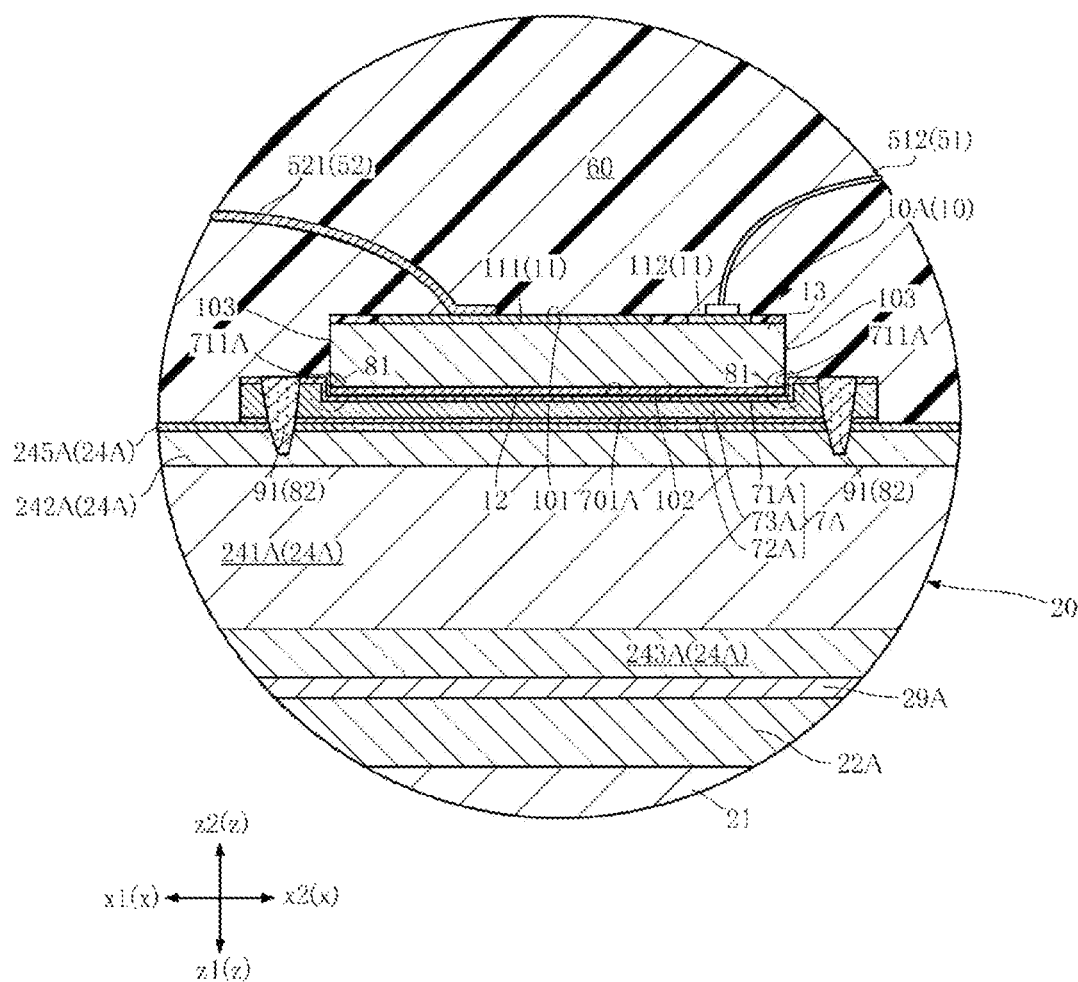
FIG. 25 is an enlarged main part cross-sectional view taken along line XXV-XXV of FIG. 24.
Figure 26:
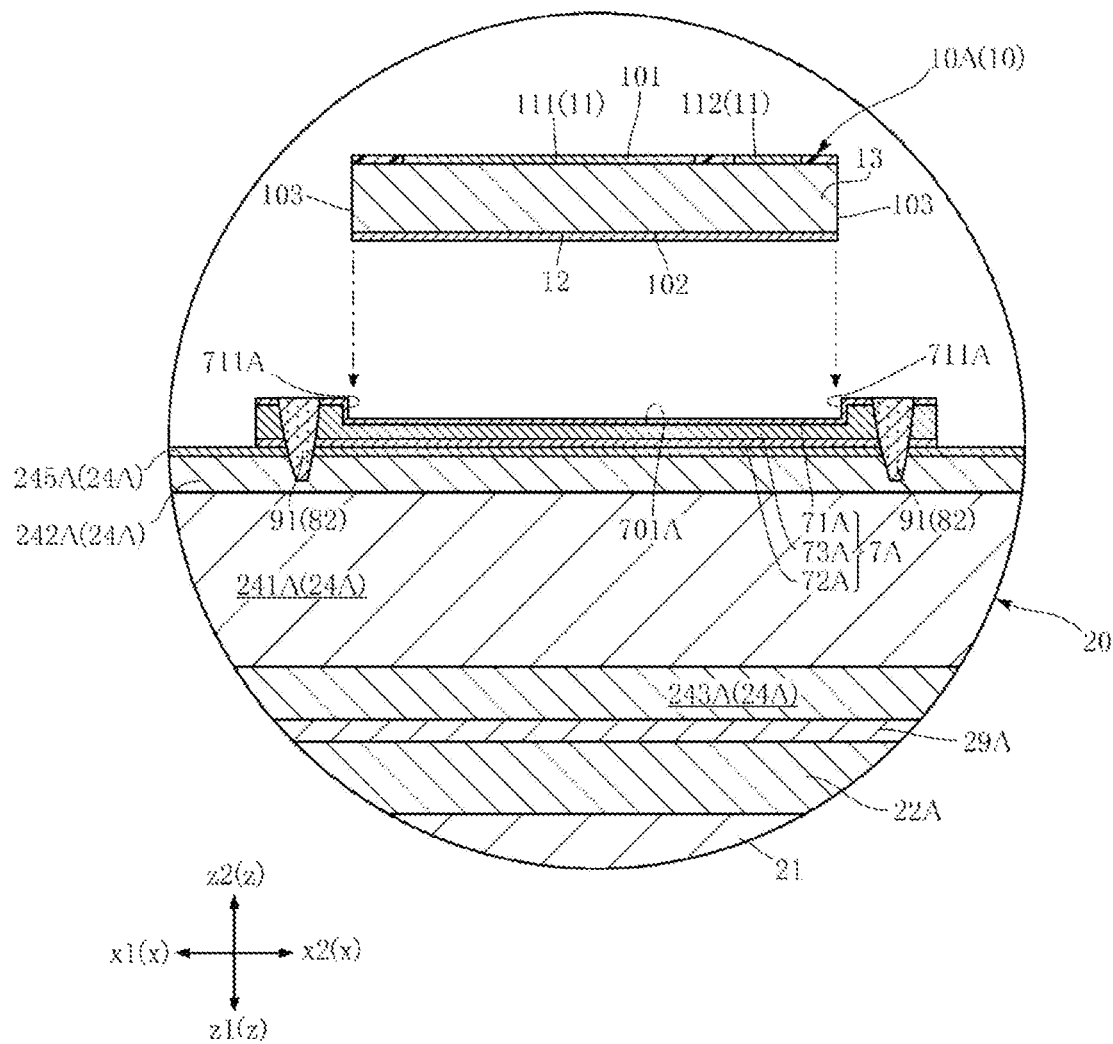
FIG. 26 is an enlarged main part cross-sectional view showing an example of a method of manufacturing the semiconductor device according to the third embodiment of the present disclosure.

FIGS. 24 to 26 show a semiconductor device according to a third embodiment of the present disclosure. The semiconductor device A3 of the third embodiment is different from that of the above-described embodiment in the specific configuration of the second positioning portion 82. Although FIGS. 24 to 26 show the semiconductor element 10A, the intermediate metal layer 7A, and the conductive member 24A, they have the same configurations as the semiconductor element 10B, the intermediate metal layer 7B, and the conductive member 24B of the third embodiment, respectively, unless otherwise stated.

The second positioning portion 82 of the third embodiment is composed of a welded portion 91. The welded portion 91 is a portion where a portion of the intermediate metal layer 7A and a portion of the conductive member 24A (the support surface layer 245A in the shown example) are welded. The welded portion 91 is provided at a position that avoids the semiconductor elements 10A and 10B when viewed along the z direction. A welding method for forming the welded portion 91 is not limited in any way, and may employ, for example, laser welding. A laser beam used for laser welding is not limited in any way. For example, a YAG laser, a second harmonic of the YAG laser, a YLF laser, a $YVO_4$ laser, a KrF laser, a $CO_2$ laser, a CO laser, or the like is appropriately used for laser welding.

Also in the third embodiment, the displacement of the semiconductor elements 10A and 10B can be suppressed. Further, by forming the second positioning portion 82 with the welded portion 91, it is possible to temporarily fix the intermediate metal layers 7A and 7B to the conductive members 24A and 24B, respectively, prior to solid phase diffusion bonding. As a result, the displacement of the semiconductor elements 10A and 10B can be further suppressed. Further, since the welded portion 91 is provided at the position that avoids the semiconductor elements 10A and 10B when viewed along the z direction, it is possible to prevent the welded portion 91 from obstructing the solid phase diffusion bonding.

The semiconductor devices according to the present disclosure are not limited to the above-described embodiments. The specific configurations of parts of the semiconductor devices according to the present disclosure can be freely changed in design in various ways. For example, the semiconductor devices according to the present disclosure include embodiments related to the following Supplementary Notes.

(Supplementary Note 1)

According to one aspect of the present disclosure, a semiconductor device includes: a semiconductor element; a support substrate configured to support the semiconductor element; an intermediate metal layer interposed between the semiconductor element and the support substrate in a thickness direction of the support substrate, wherein the semiconductor element and the intermediate metal layer are bonded by solid phase diffusion bonding; and a first positioning portion including a portion of the semiconductor element and a first portion of the intermediate metal layer and configured to suppress relative movement between the semiconductor element and the intermediate metal layer.

(Supplementary Note 2)

In the semiconductor device of Supplementary Note 1, in the first positioning portion, the portion of the semiconductor element and the first portion of the intermediate metal layer are engaged with each other.

(Supplementary Note 3)

In the semiconductor device of Supplementary Note 2, the semiconductor element includes an element facing surface that constitutes the first positioning portion, the intermediate metal layer includes a first facing surface that constitutes the first positioning portion, and the element facing surface and the first facing surface face each other in a direction intersecting the thickness direction.

(Supplementary Note 4)

In the semiconductor device of Supplementary Note 3, the intermediate metal layer includes a first recess that is recessed in the thickness direction from a side where the semiconductor element is located, and the first facing surface is an inner surface of the first recess.

(Supplementary Note 5)

In the semiconductor device of any one of Supplementary Notes 1 to 4, the intermediate metal layer and the support substrate are bonded to each other by solid phase diffusion bonding, and the semiconductor device further includes: a second positioning portion including a second portion of the intermediate metal layer and a portion of the support substrate and configured to suppress relative movement between the intermediate metal layer and the support substrate.

(Supplementary Note 6)

In the semiconductor device of Supplementary Note 5, in the second positioning portion, the second portion of the intermediate metal layer and the portion of the support substrate are engaged with each other.

(Supplementary Note 7)

In the semiconductor device of Supplementary Note 6, the intermediate metal layer includes a second facing surface that constitutes the second positioning portion, the support substrate includes a substrate facing surface that constitutes the second positioning portion, and the second facing surface and the substrate facing surface face each other in a direction intersecting the thickness direction.

(Supplementary Note 8)

In the semiconductor device of Supplementary Note 7, the intermediate metal layer includes a second recess that is recessed in the thickness direction from a side where the support substrate is located, and the second facing surface is an inner surface of the second recess.

(Supplementary Note 9)

In the semiconductor device of Supplementary Note 7, the support substrate includes a substrate recess that is recessed in the thickness direction from a side where the intermediate metal layer is located, and the substrate facing surface is an inner surface of the substrate recess.

(Supplementary Note 10)

In the semiconductor device of Supplementary Note 5, in the second positioning portion, the second portion of the intermediate metal layer and the portion of the support substrate are bonded to each other by welding.

(Supplementary Note 11)

In the semiconductor device of any one of Supplementary Notes 5 to 10, the semiconductor element includes a back surface metal layer bonded to the intermediate metal layer by solid phase diffusion bonding, and the back surface metal layer is made of a first metal.

(Supplementary Note 12)

In the semiconductor device of Supplementary Note 11, the intermediate metal layer includes a first layer bonded to the back surface metal layer of the semiconductor element by solid phase diffusion bonding, and the first layer is made of the first metal.

(Supplementary Note 13)

In the semiconductor device of Supplementary Note 12, the support substrate includes a support surface layer bonded to the intermediate metal layer by solid phase diffusion bonding, and the support surface layer is made of a second metal.

(Supplementary Note 14)

In the semiconductor device of Supplementary Note 13, the intermediate metal layer includes a second layer bonded to the support surface layer of the support substrate by solid phase diffusion bonding, and the second layer is made of the second metal.

(Supplementary Note 15)

In the semiconductor device of Supplementary Note 14, the intermediate metal layer includes a third layer interposed between the first layer and the second layer, and the third layer is made of a third metal softer than the first metal and the second metal.

(Supplementary Note 16)

In the semiconductor device of Supplementary Note 15, a thickness of the third layer is thicker than thicknesses of the first layer and the second layer.

(Supplementary Note 17)

In the semiconductor device of Supplementary Note 16, the first metal and the second metal contain Ag.

(Supplementary Note 18)

In the semiconductor device of Supplementary Note 17, the third layer contains Al.

According to the present disclosure in some embodiments, it is possible to provide a semiconductor device capable of suppressing the displacement of semiconductor elements.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:
a semiconductor element;
a support substrate configured to support the semiconductor element;
an intermediate metal layer interposed between the semiconductor element and the support substrate in a thickness direction of the support substrate, wherein the semiconductor
element and the intermediate metal layer are bonded by solid phase diffusion bonding; and
a first positioning portion including a portion of the semiconductor element and a first portion of the intermediate metal layer and configured to suppress relative movement between
the semiconductor element and the intermediate metal layer, wherein in the first positioning portion, the portion of the semiconductor element and the first portion of the intermediate metal layer are engaged with each other, wherein the semiconductor element includes an element facing surface that constitutes the first positioning portion, wherein the intermediate metal layer includes a first facing surface that constitutes the first positioning portion, wherein the element facing surface and the first facing surface face each other in a direction intersecting the thickness direction, wherein the intermediate metal layer includes a first recess that is recessed in the thickness direction from a side where the semiconductor element is located, and wherein the first facing surface is an inner surface of the first recess.

2. A semiconductor device, comprising:

a semiconductor element;

a support substrate configured to support the semiconductor element;

an intermediate metal layer interposed between the semiconductor element and the support substrate in a thickness direction of the support substrate, wherein the semiconductor element and the intermediate metal layer are bonded by solid phase diffusion bonding; and a first positioning portion including a portion of the semiconductor element and a first portion of the intermediate metal layer and configured to suppress relative movement between the semiconductor element and the intermediate metal layer, wherein the intermediate metal layer and the support substrate are bonded to each other by solid phase diffusion bonding, and wherein the semiconductor device further comprises: a second positioning portion including a second portion of the intermediate metal layer and a portion of the support substrate and configured to suppress relative movement between the intermediate metal layer and the support substrate, wherein in the second positioning portion, the second portion of the intermediate metal layer and the portion of the support substrate are engaged with each other, wherein the intermediate metal layer includes a second facing surface that constitutes the second positioning portion, wherein the support substrate includes a substrate facing surface that constitutes the second positioning portion, wherein the second facing surface and the substrate facing surface face each other in a direction intersecting the thickness direction, wherein the intermediate metal layer includes a second recess that is recessed in the thickness direction from a side where the support substrate is located, and wherein the second facing surface is an inner surface of the second recess.

3. The semiconductor device of claim 2, wherein in the second positioning portion, the second portion of the intermediate metal layer and the portion of the support substrate are bonded to each other by welding.

4. The semiconductor device of claim 2, wherein the semiconductor element includes a back surface metal layer bonded to the intermediate metal layer by solid phase diffusion bonding, and wherein the back surface metal layer is made of a first metal.

5. The semiconductor device of claim 4, wherein the intermediate metal layer includes a first layer bonded to the back surface metal layer of the semiconductor element by solid phase diffusion bonding, and wherein the first layer is made of the first metal.

6. The semiconductor device of claim 5, wherein the support substrate includes a support surface layer bonded to the intermediate metal layer by solid phase diffusion bonding, and wherein the support surface layer is made of a second metal.

7. The semiconductor device of claim 6, wherein the intermediate metal layer includes a second layer bonded to the support surface layer of the support substrate by solid phase diffusion bonding, and wherein the second layer is made of the second metal.

8. The semiconductor device of claim 7, wherein the intermediate metal layer includes a third layer interposed between the first layer and the second layer, and wherein the third layer is made of a third metal softer than the first metal and the second metal.

9. The semiconductor device of claim 8, wherein a thickness of the third layer is thicker than thicknesses of the first layer and the second layer.

10. The semiconductor device of claim 9, wherein the first metal and the second metal contain Ag.

11. The semiconductor device of claim 10, wherein the third layer contains Al.

12. A semiconductor device, comprising:

a semiconductor element;

a support substrate configured to support the semiconductor element;

an intermediate metal layer interposed between the semiconductor element and the support substrate in a thickness direction of the support substrate, wherein the semiconductor element and the intermediate metal layer are bonded by solid phase diffusion bonding; and a first positioning portion including a portion of the semiconductor element and a first portion of the intermediate metal layer and configured to suppress relative movement between the semiconductor element and the intermediate metal layer, wherein the intermediate metal layer and the support substrate are bonded to each other by solid phase diffusion bonding, wherein the semiconductor device further comprises: a second positioning portion including a second portion of the intermediate metal layer and a portion of the support substrate and configured to suppress relative movement between the intermediate metal layer and the support substrate, wherein in the second positioning portion, the second portion of the intermediate metal layer and the portion of the support substrate are engaged with each other, wherein the intermediate metal layer includes a second facing surface that constitutes the second positioning portion, wherein the support substrate includes a substrate facing surface that constitutes the second positioning portion, wherein the second facing surface and the substrate facing surface face each other in a direction intersecting the thickness direction, wherein the support substrate includes a substrate recess that is recessed in the thickness direction from a side where the intermediate metal layer is located, and wherein the substrate facing surface is an inner surface of the substrate recess.

13. The semiconductor device of claim 12, wherein in the second positioning portion, the second portion of the intermediate metal layer and the portion of the support substrate are bonded to each other by welding.

14. The semiconductor device of claim 12, wherein the semiconductor element includes a back surface metal layer bonded to the intermediate metal layer by solid phase diffusion bonding, and wherein the back surface metal layer is made of a first metal.

15. The semiconductor device of claim 14, wherein the intermediate metal layer includes a first layer bonded to the back surface metal layer of the semiconductor element by solid phase diffusion bonding, and wherein the first layer is made of the first metal.

16. The semiconductor device of claim 15, wherein the support substrate includes a support surface layer bonded to the intermediate metal layer by solid phase diffusion bonding, and wherein the support surface layer is made of a second metal.

17. The semiconductor device of claim 16, wherein the intermediate metal layer includes a second layer bonded to the support surface layer of the support substrate by solid phase diffusion bonding, and wherein the second layer is made of the second metal.

18. The semiconductor device of claim 17, wherein the intermediate metal layer includes a third layer interposed between the first layer and the second layer, and wherein the third layer is made of a third metal softer than the first metal and the second metal.

19. The semiconductor device of claim 18, wherein a thickness of the third layer is thicker than thicknesses of the first layer and the second layer.

20. The semiconductor device of claim 19, wherein the first metal and the second metal contain Ag.

* * * * *